US010854571B2

(12) United States Patent
Akutsu et al.

(10) Patent No.: US 10,854,571 B2
(45) Date of Patent: Dec. 1, 2020

(54) ANISOTROPIC CONDUCTIVE FILM WITH CONDUCTIVE PARTICLES FORMING REPEATING UNITS OF POLYGONS

(71) Applicant: DEXERIALS CORPORATION, Tokyo (JP)

(72) Inventors: Yasushi Akutsu, Utsunomiya (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/096,606

(22) PCT Filed: Apr. 25, 2017

(86) PCT No.: PCT/JP2017/016282
§ 371 (c)(1),
(2) Date: Oct. 25, 2018

(87) PCT Pub. No.: WO2017/191779
PCT Pub. Date: Nov. 9, 2017

(65) Prior Publication Data
US 2019/0096843 A1  Mar. 28, 2019

(30) Foreign Application Priority Data

May 5, 2016 (JP) ................................. 2016-092902
Apr. 24, 2017 (JP) ................................. 2017-085743

(51) Int. Cl.
*H01L 23/00* (2006.01)
*C09J 9/02* (2006.01)
*H01B 1/22* (2006.01)

(52) U.S. Cl.
CPC ............... *H01L 24/29* (2013.01); *C09J 9/02* (2013.01); *H01B 1/22* (2013.01); *H01L 24/27* (2013.01);
(Continued)

(58) Field of Classification Search
CPC .......................................... H01L 2224/83851
See application file for complete search history.

(56) References Cited

U.S. PATENT DOCUMENTS

2013/0071636 A1* 3/2013 Lee ........................... C09J 9/02
428/206
2013/0140085 A1* 6/2013 Hayashi ................... H01B 1/20
174/94 R
(Continued)

FOREIGN PATENT DOCUMENTS

CN  107078420 A    8/2017
JP  H09-320345   * 12/1997
(Continued)

OTHER PUBLICATIONS

Jul. 25, 2017 International Search Report issued in International Patent Application No. PCT/JP2017/016282.
(Continued)

*Primary Examiner* — Nduka E Ojeh
(74) *Attorney, Agent, or Firm* — Oliff PLC

(57) ABSTRACT

An anisotropic conductive film capable of accommodating bumps with a narrow pitch and reducing the number density of conductive particles in comparison to known anisotropic conductive films. In an anisotropic conductive film, conductive particles are disposed in an insulating resin binder, and repeating units of polygons formed by successively connecting the centers of a plurality of conductive particles are disposed repeatedly in the vertical and horizontal directions in a plan view. The sides of the polygons of the repeating units intersect diagonally with the long-side direction or the short-side direction of the anisotropic conductive film.

16 Claims, 20 Drawing Sheets

(52) U.S. Cl.
CPC .............. *H01L 24/73* (2013.01); *H01L 24/83* (2013.01); *H01L 24/16* (2013.01); *H01L 24/17* (2013.01); *H01L 24/32* (2013.01); *H01L 24/81* (2013.01); *H01L 2224/16225* (2013.01); *H01L 2224/1714* (2013.01); *H01L 2224/2731* (2013.01); *H01L 2224/27436* (2013.01); *H01L 2224/2919* (2013.01); *H01L 2224/2929* (2013.01); *H01L 2224/2939* (2013.01); *H01L 2224/29082* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29386* (2013.01); *H01L 2224/29455* (2013.01); *H01L 2224/29499* (2013.01); *H01L 2224/32225* (2013.01); *H01L 2224/73204* (2013.01); *H01L 2224/81903* (2013.01); *H01L 2224/83101* (2013.01); *H01L 2224/83203* (2013.01); *H01L 2224/83851* (2013.01); *H01L 2924/00014* (2013.01); *H01L 2924/14* (2013.01); *H01L 2924/15788* (2013.01)

(56) References Cited

U.S. PATENT DOCUMENTS

| | | | |
|---|---|---|---|
| 2014/0141195 A1* | 5/2014 | Liang | C09J 7/20 428/98 |
| 2017/0162529 A1* | 6/2017 | Shinohara | C09J 7/10 |
| 2017/0317047 A1* | 11/2017 | Akutsu | H01L 24/29 |

FOREIGN PATENT DOCUMENTS

| | | |
|---|---|---|
| JP | H09-320345 A | 12/1997 |
| JP | 2007-019550 A | 1/2007 |
| JP | 2007-080522 A | 3/2007 |
| JP | 2007080522 A * | 3/2007 |
| JP | 2009-076431 A | 4/2009 |
| JP | 4887700 B2 | 2/2012 |
| JP | 2015-232660 A | 12/2015 |
| JP | 2016-066573 A | 4/2016 |

OTHER PUBLICATIONS

Jul. 25, 2017 Written Opinion of the International Searching Authority issued in International Patent Application No. PCT/JP2017/016282.

Jun. 12, 2018 Written Opinion of the International Preliminary Examining Authority issued in International Patent Application No. PCT/JP2017/016282.

Aug. 29, 2018 International Preliminary Report on Patentability issued in International Patent Application No. PCT/JP2017/016282.

Aug. 2, 2019 Office Action issued in Korean Patent Application No. 10-2018-7021396.

Sep. 29, 2019 Office Action issued in Chinese Patent Application No. 201780025129.X.

Feb. 20, 2020 Office Action issued in Korean Patent Application No. 10-2018-7021396.

Sep. 2, 2020 Office Action issued in Chinese Patent Application No. 201780025129.X.

* cited by examiner

[FIG. 1A]
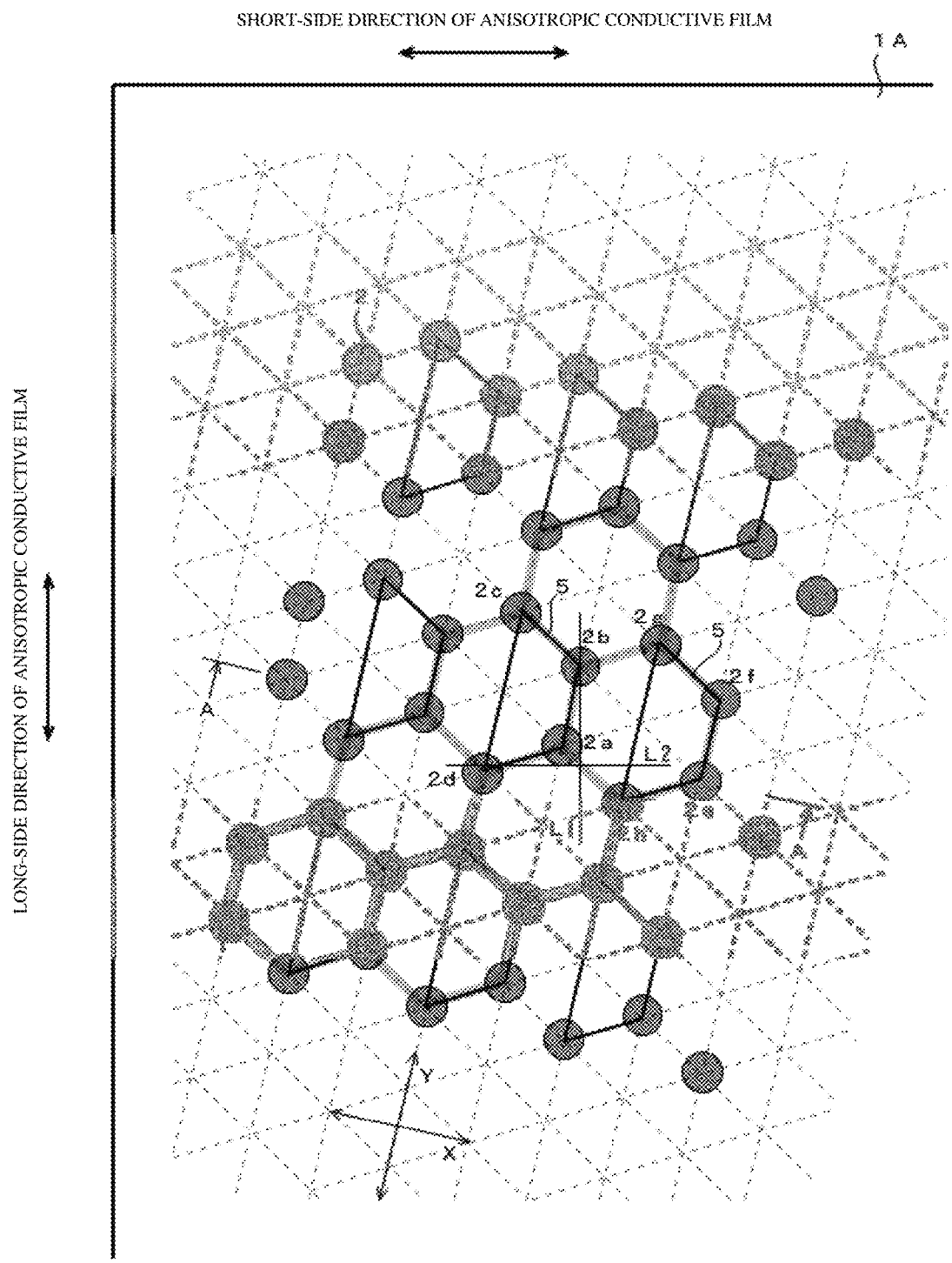

[FIG. 1B]
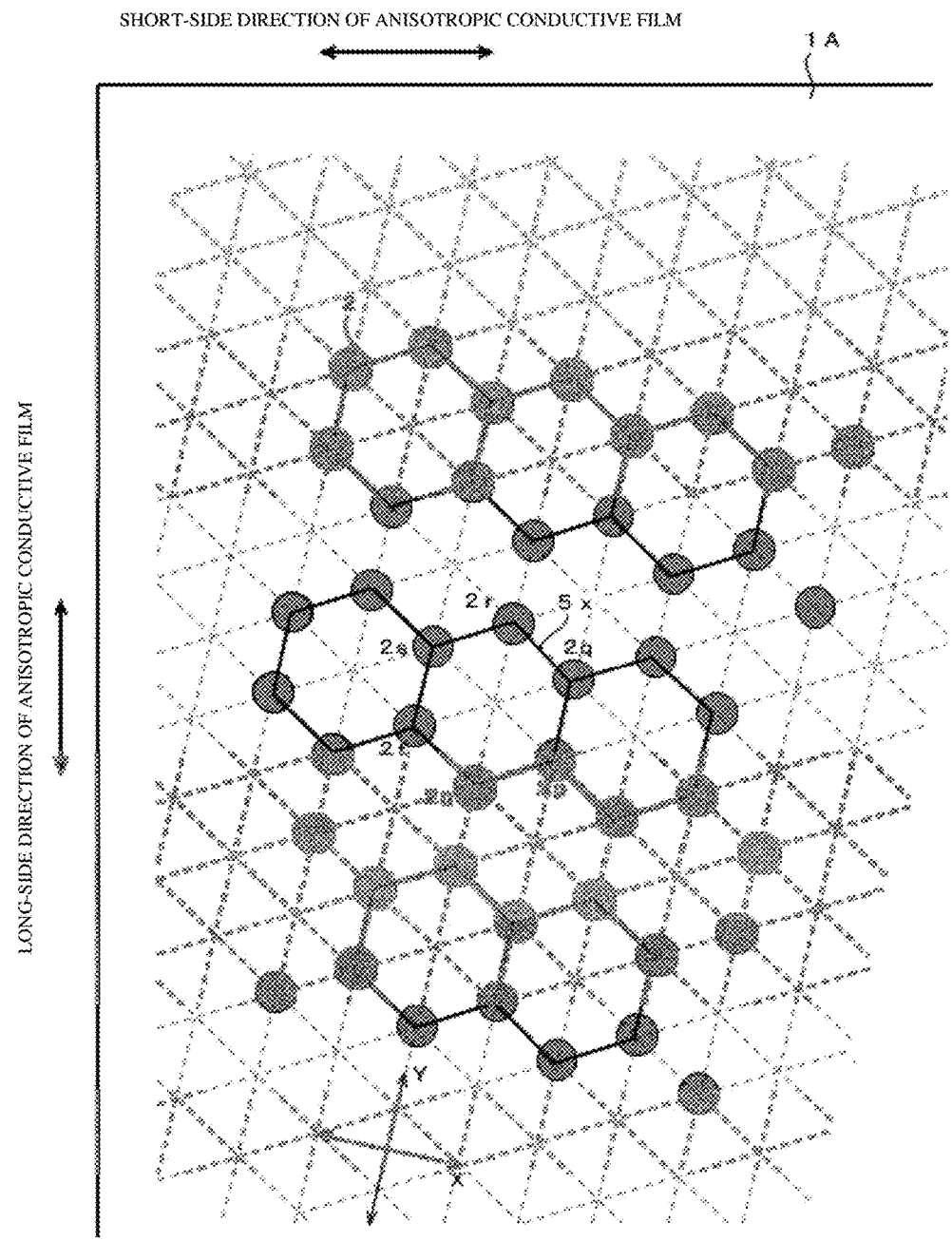
[FIG. 1C]
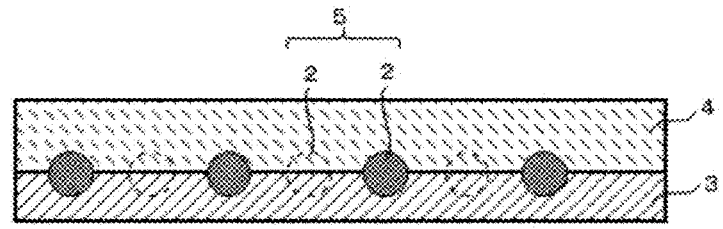
(CROSS-SECTIONAL VIEW ALONG A-A)

[FIG. 2A]
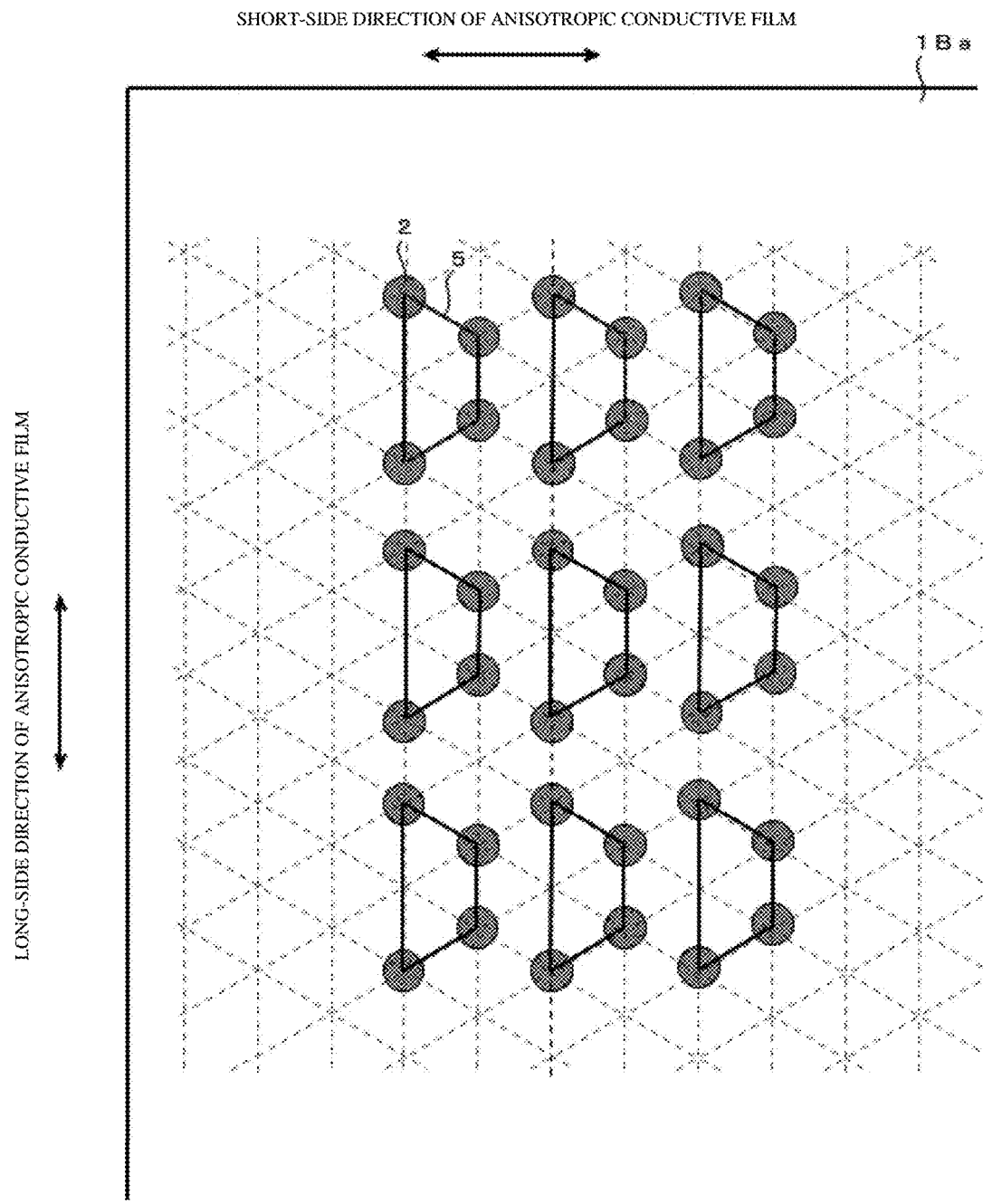

[FIG. 2B]
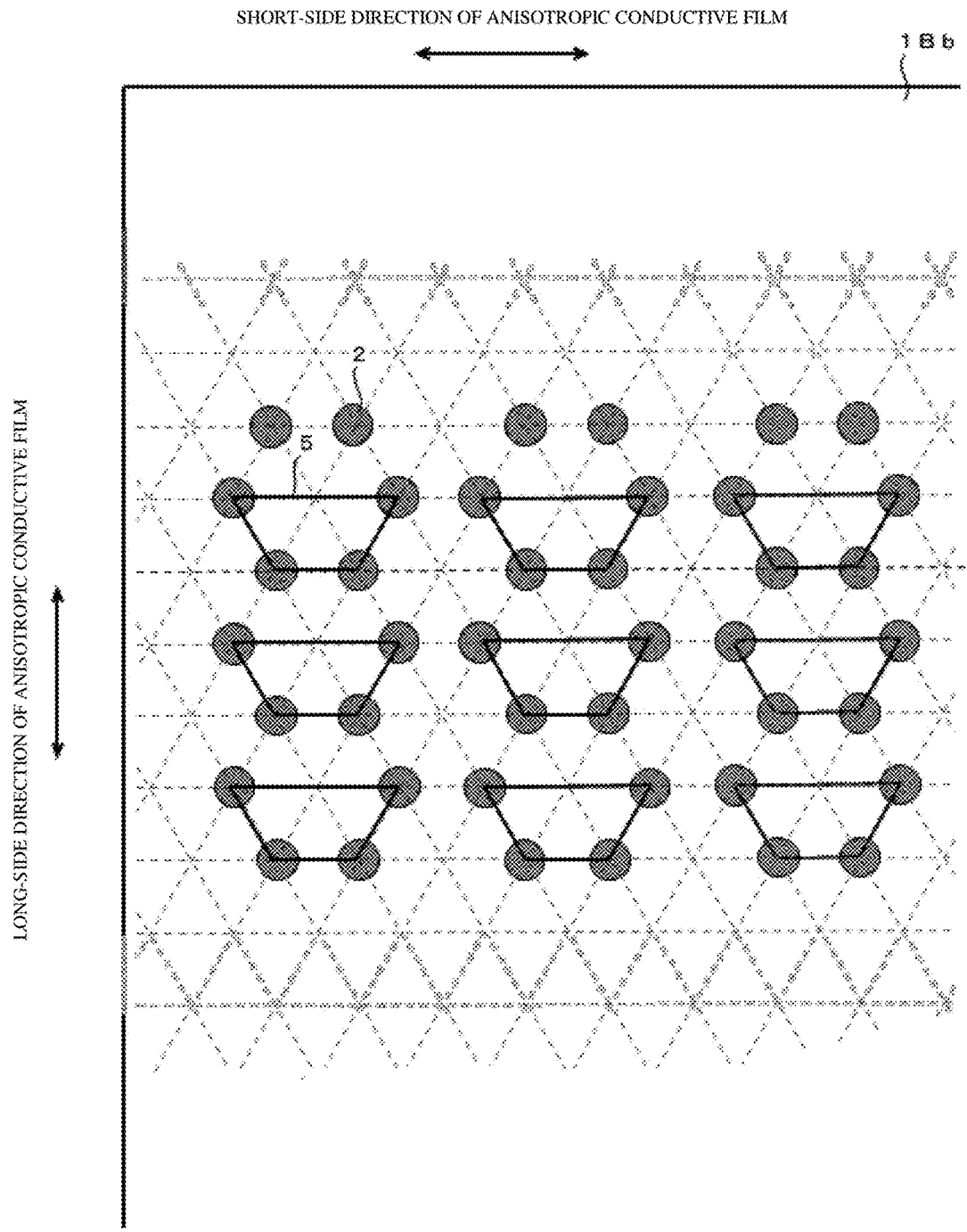

[FIG. 3A]
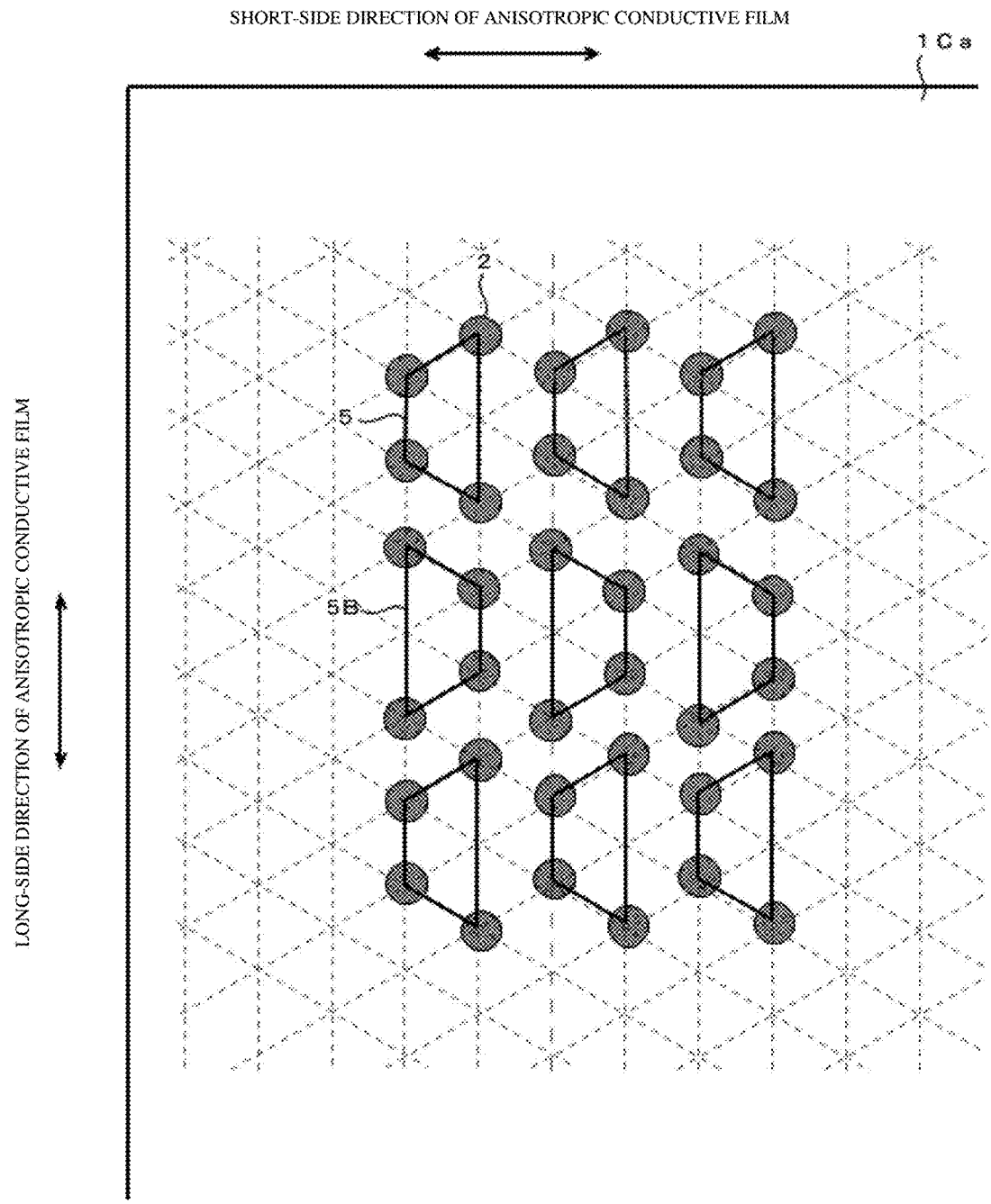

[FIG. 3B]
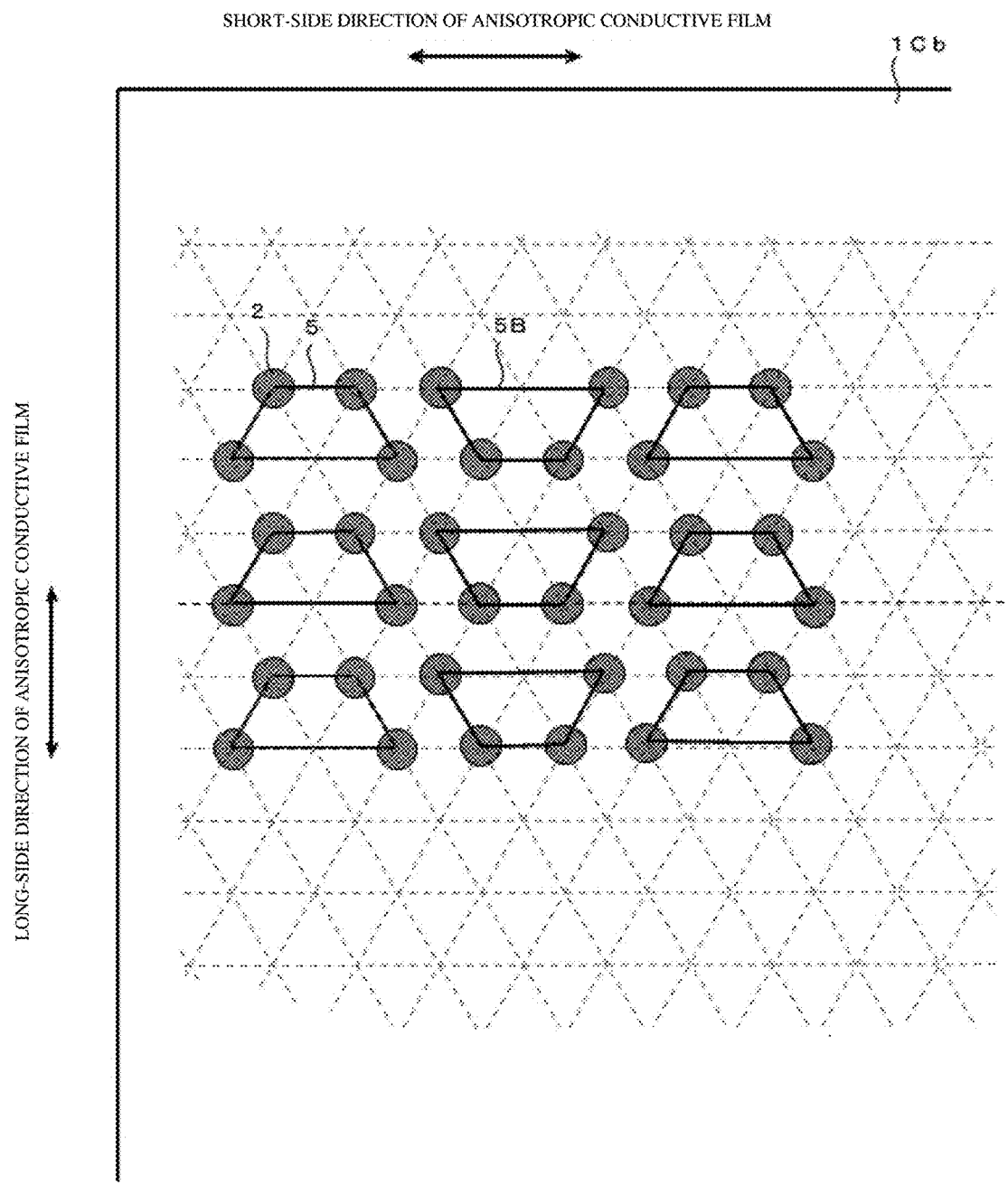

[FIG. 4A]
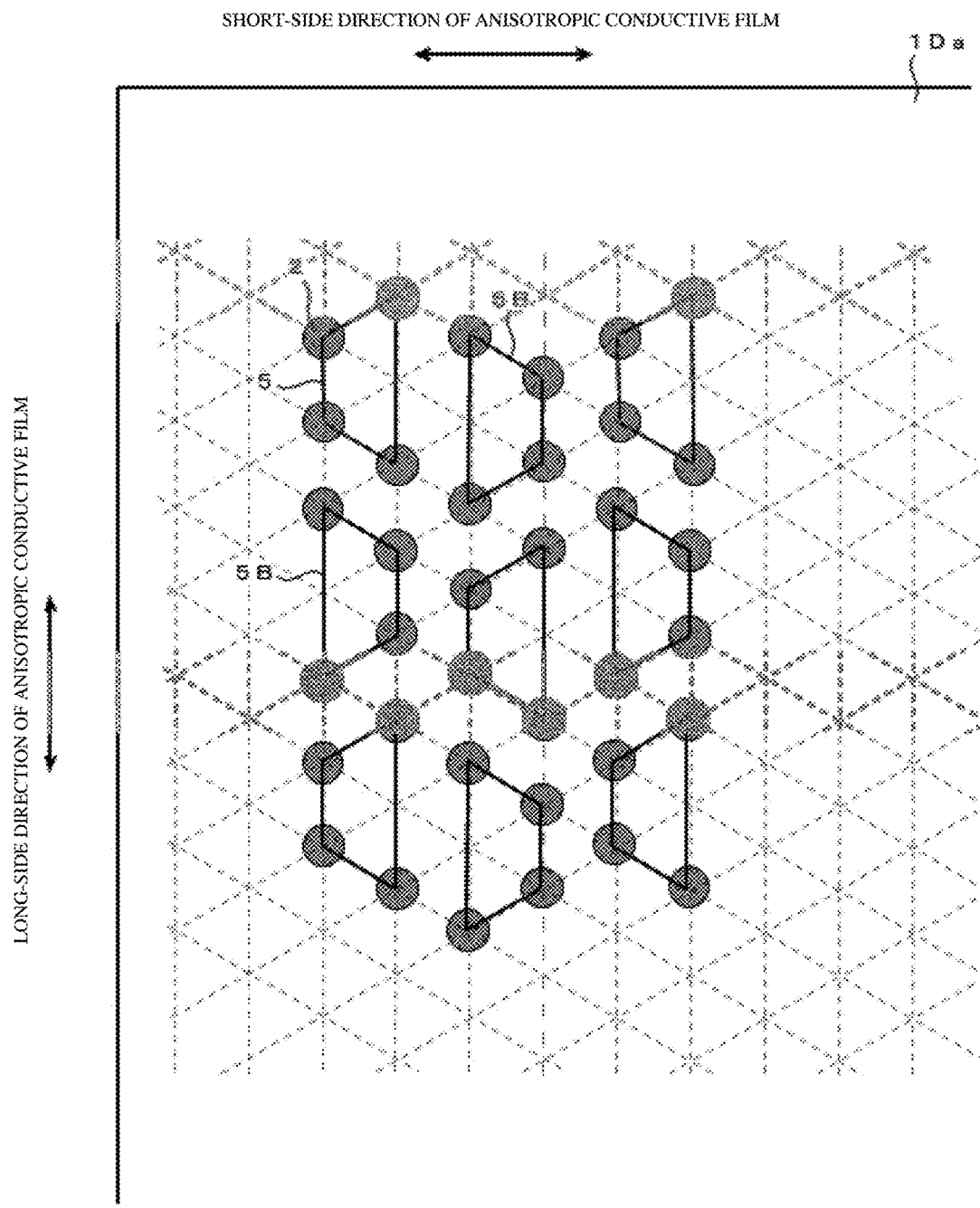

[FIG. 4B]
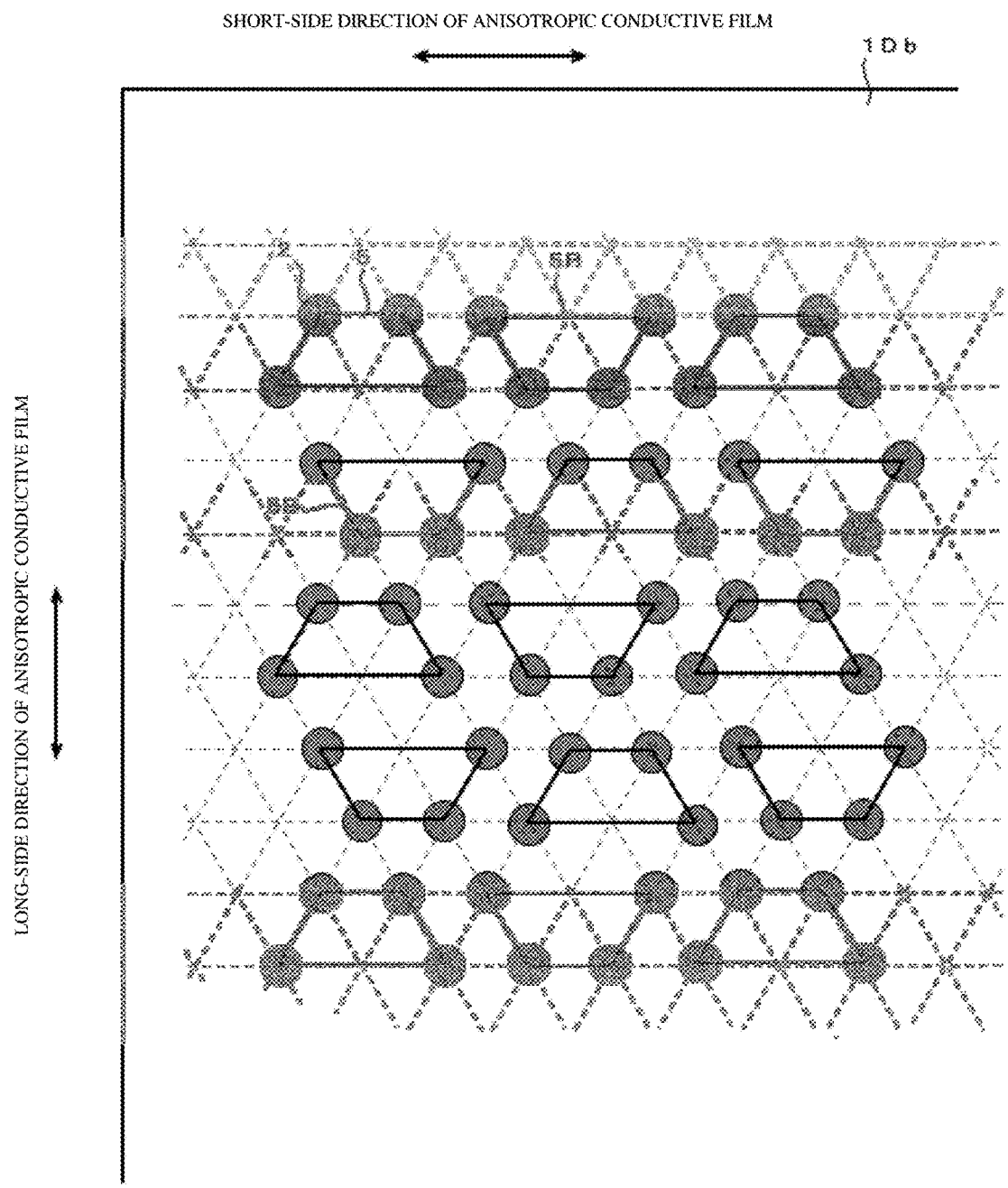

[FIG. 5A]
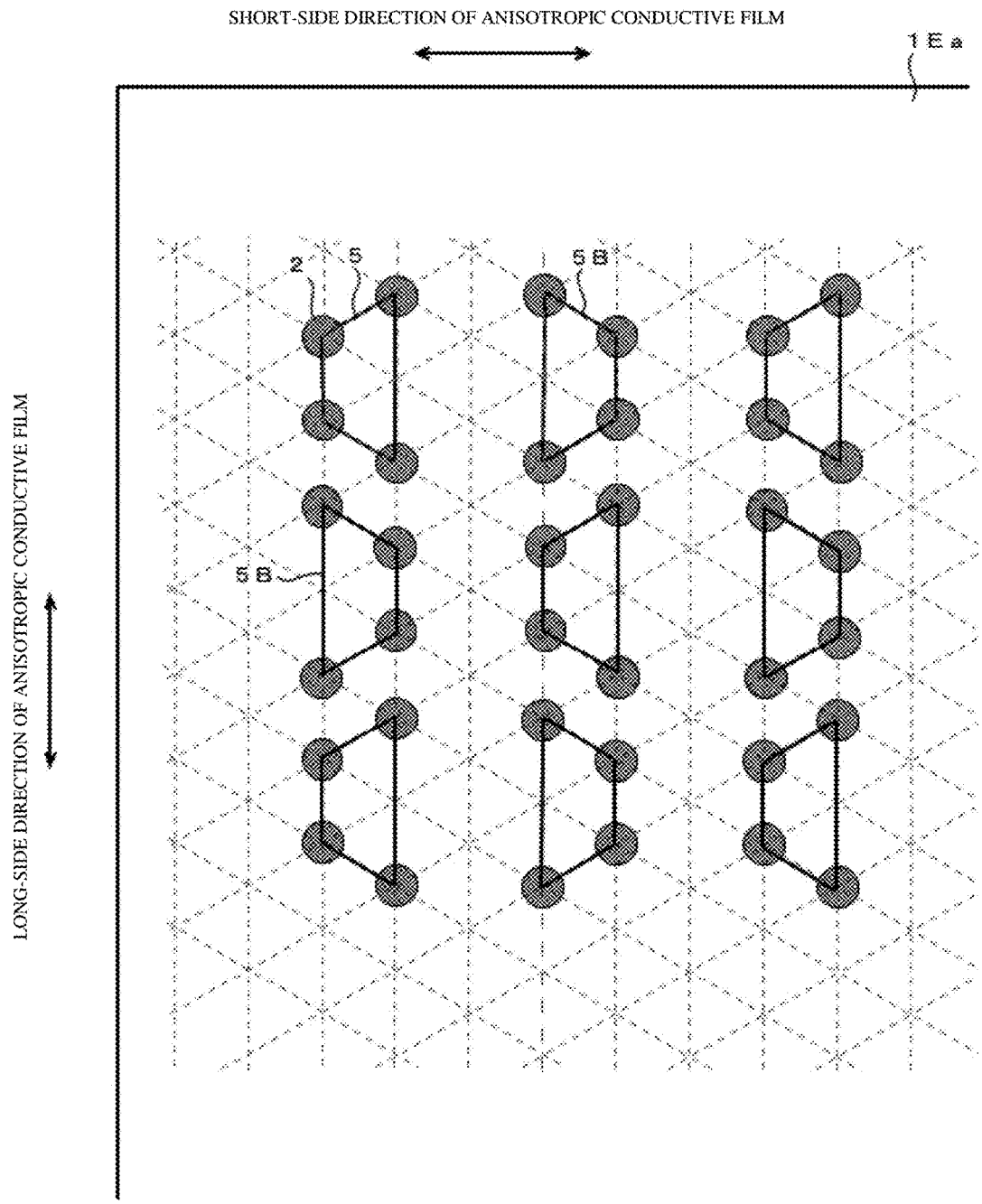

[FIG. 5B]
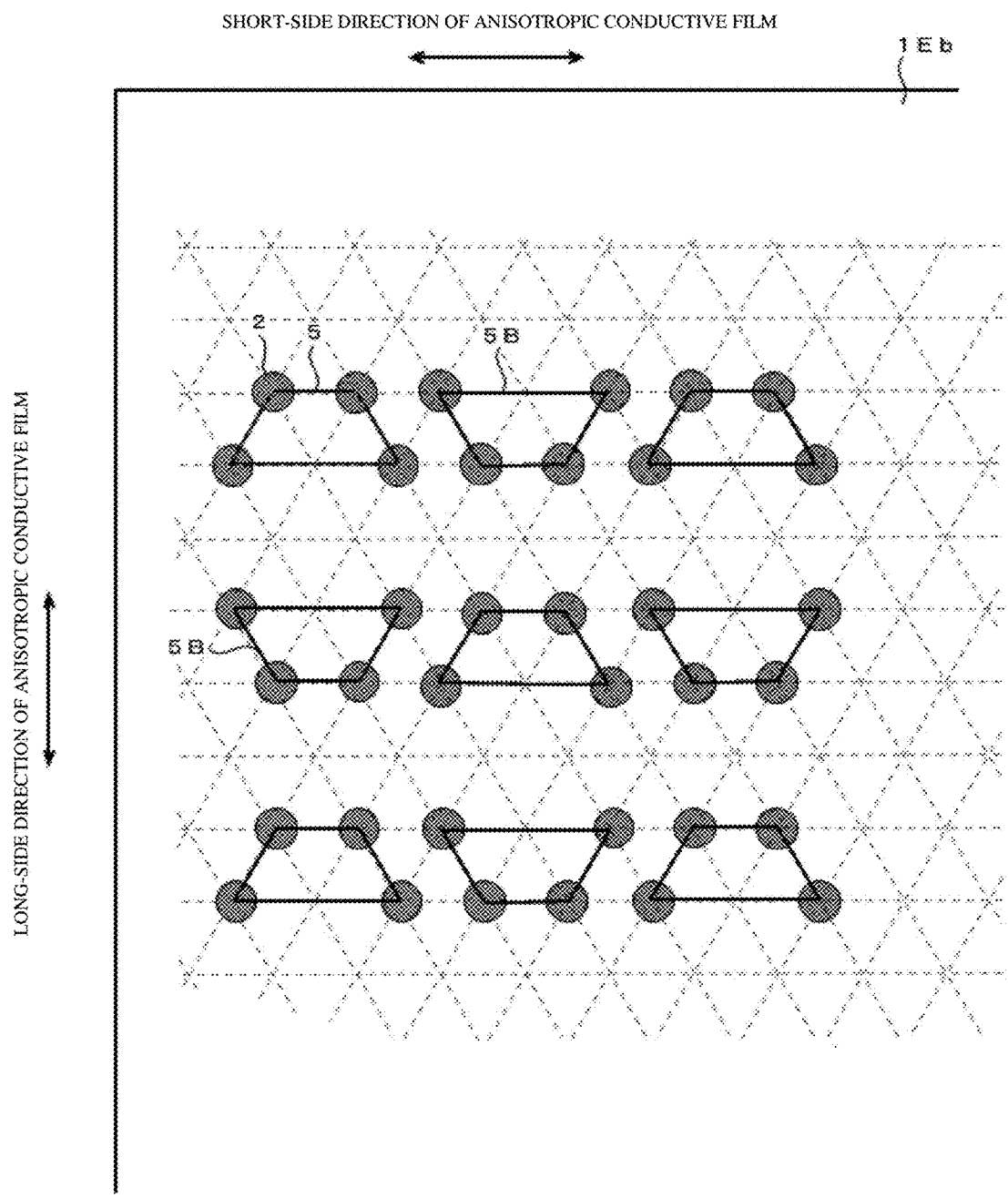

[FIG. 6]
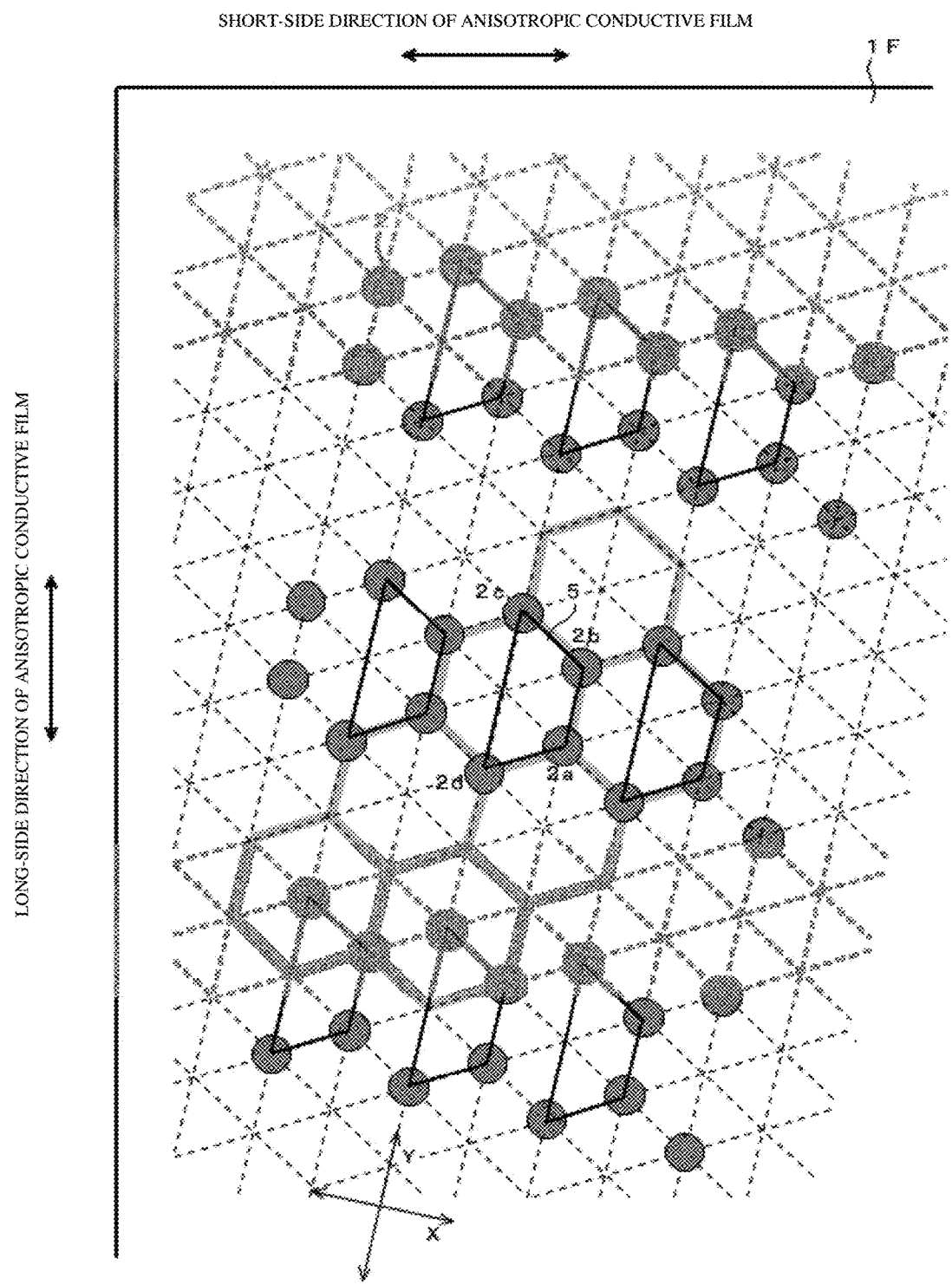

[FIG. 7]
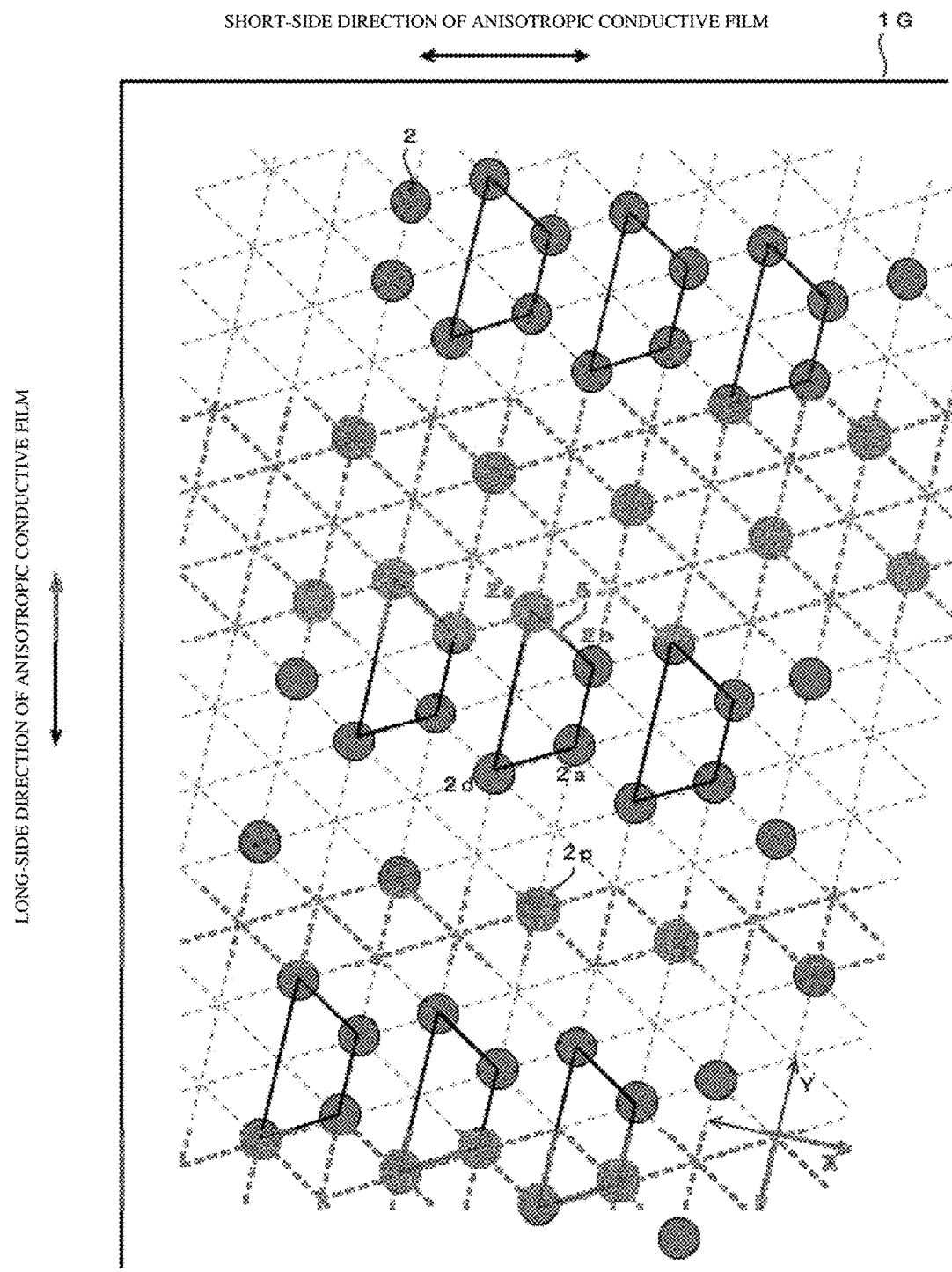

[FIG. 8]
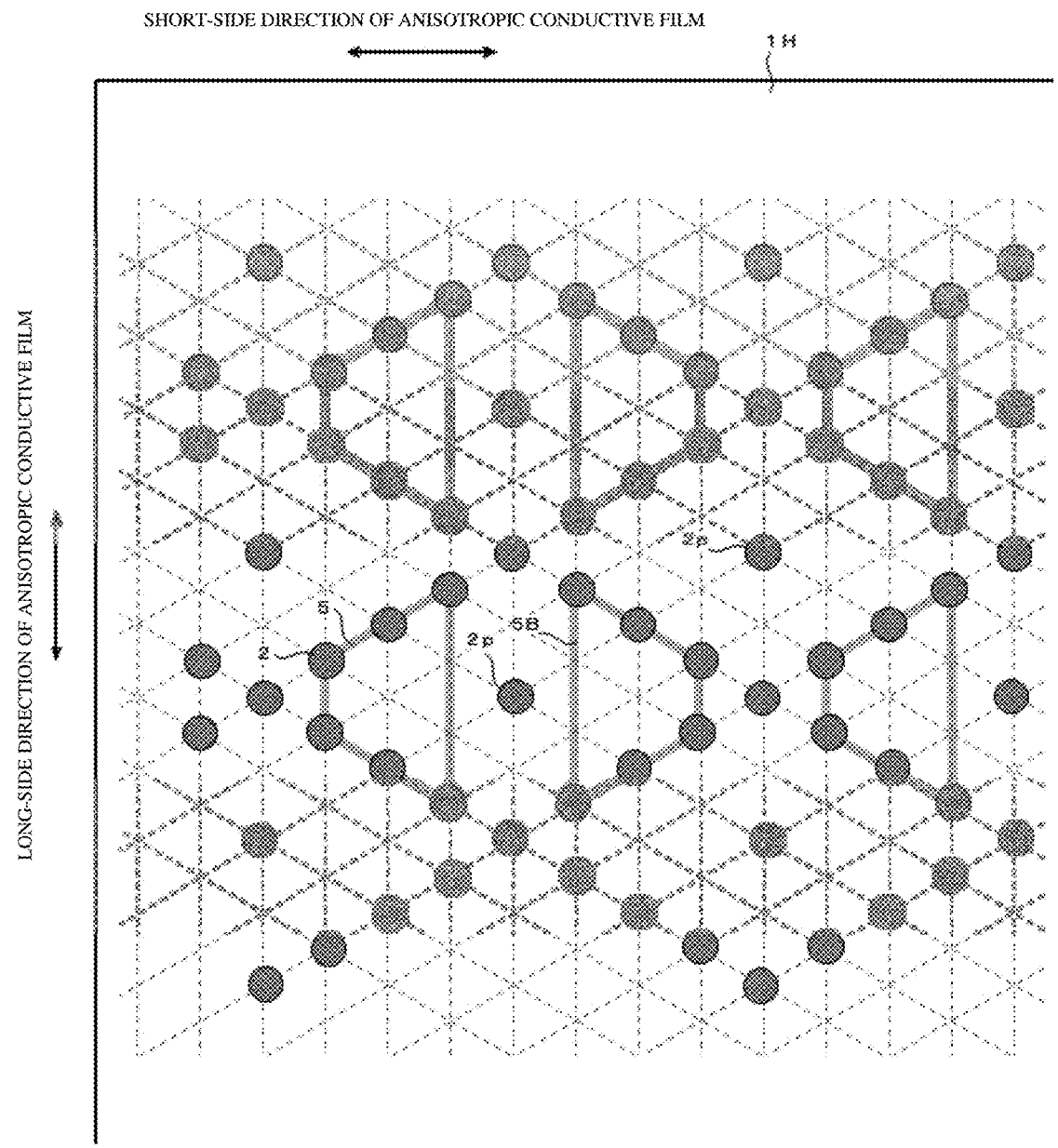

[FIG. 9]
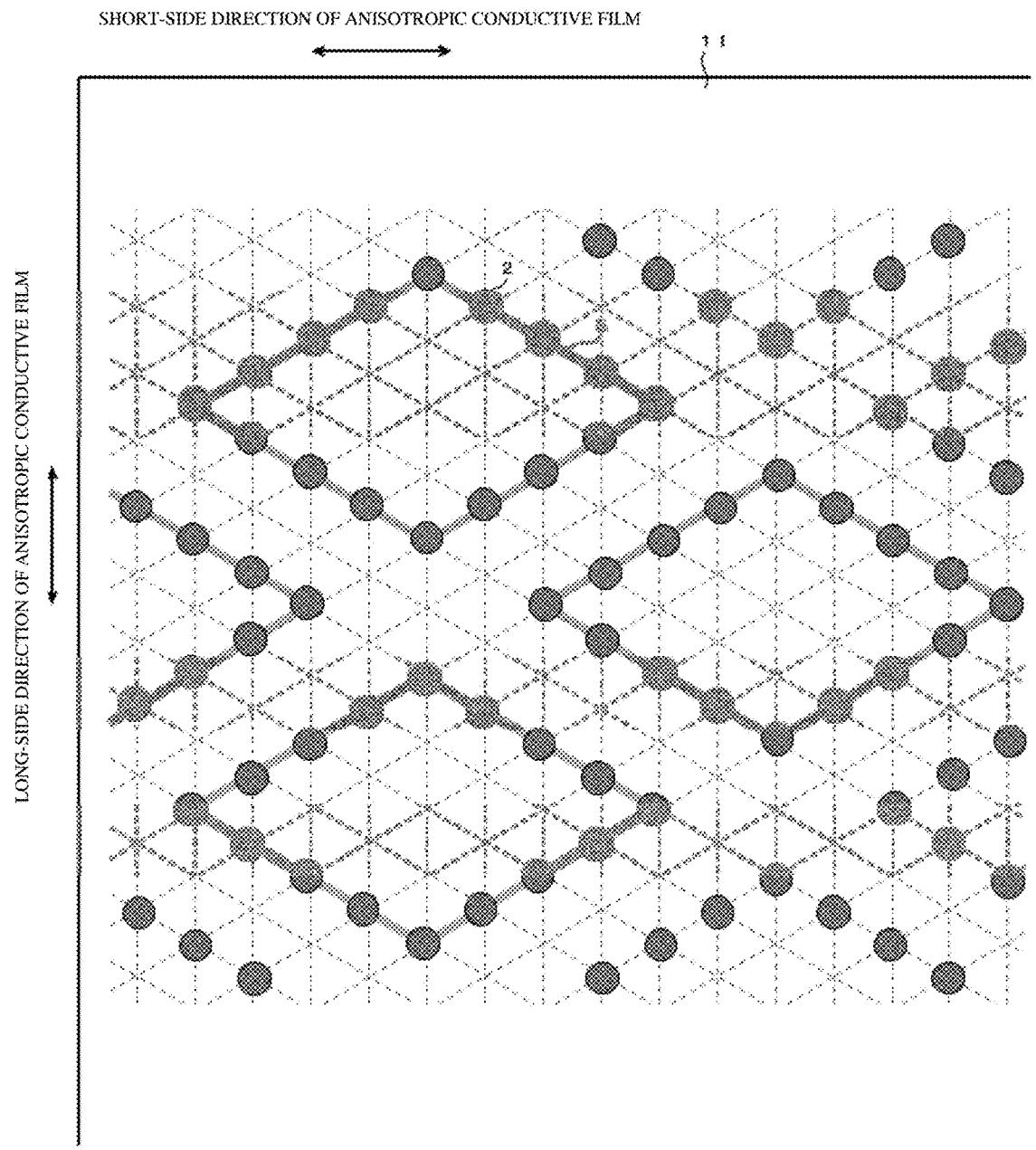

[FIG. 10]
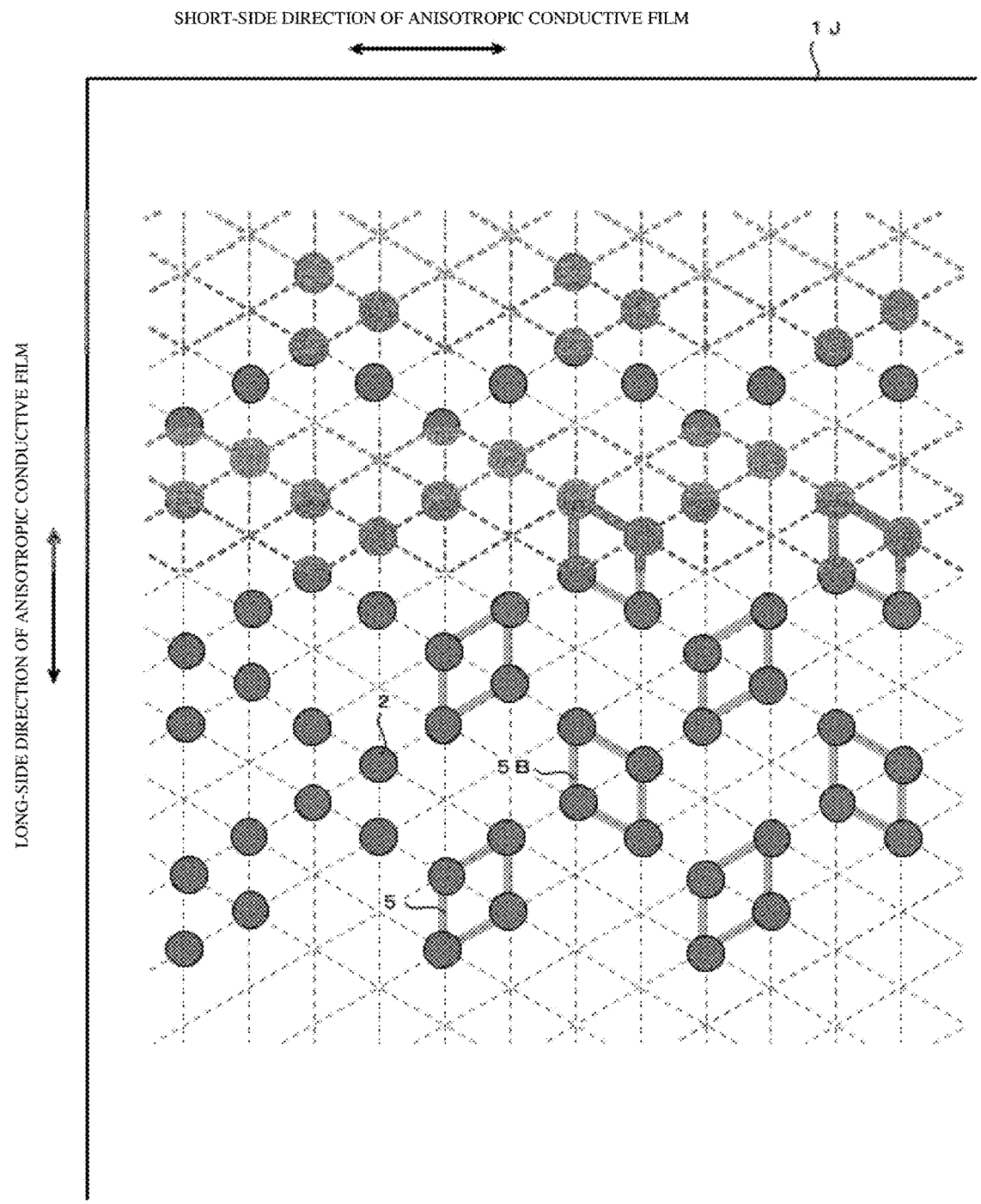

[FIG. 11]
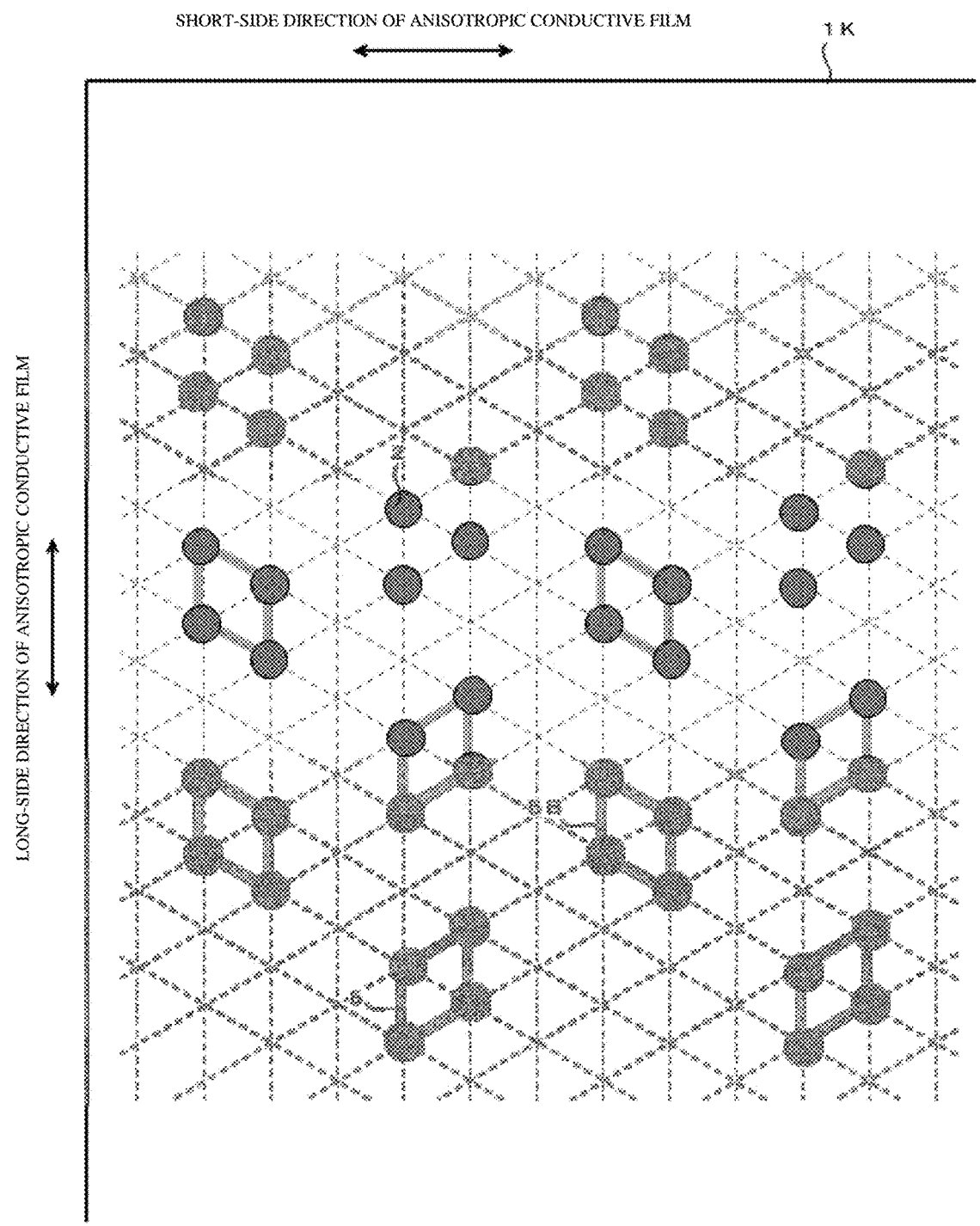

[FIG. 12]
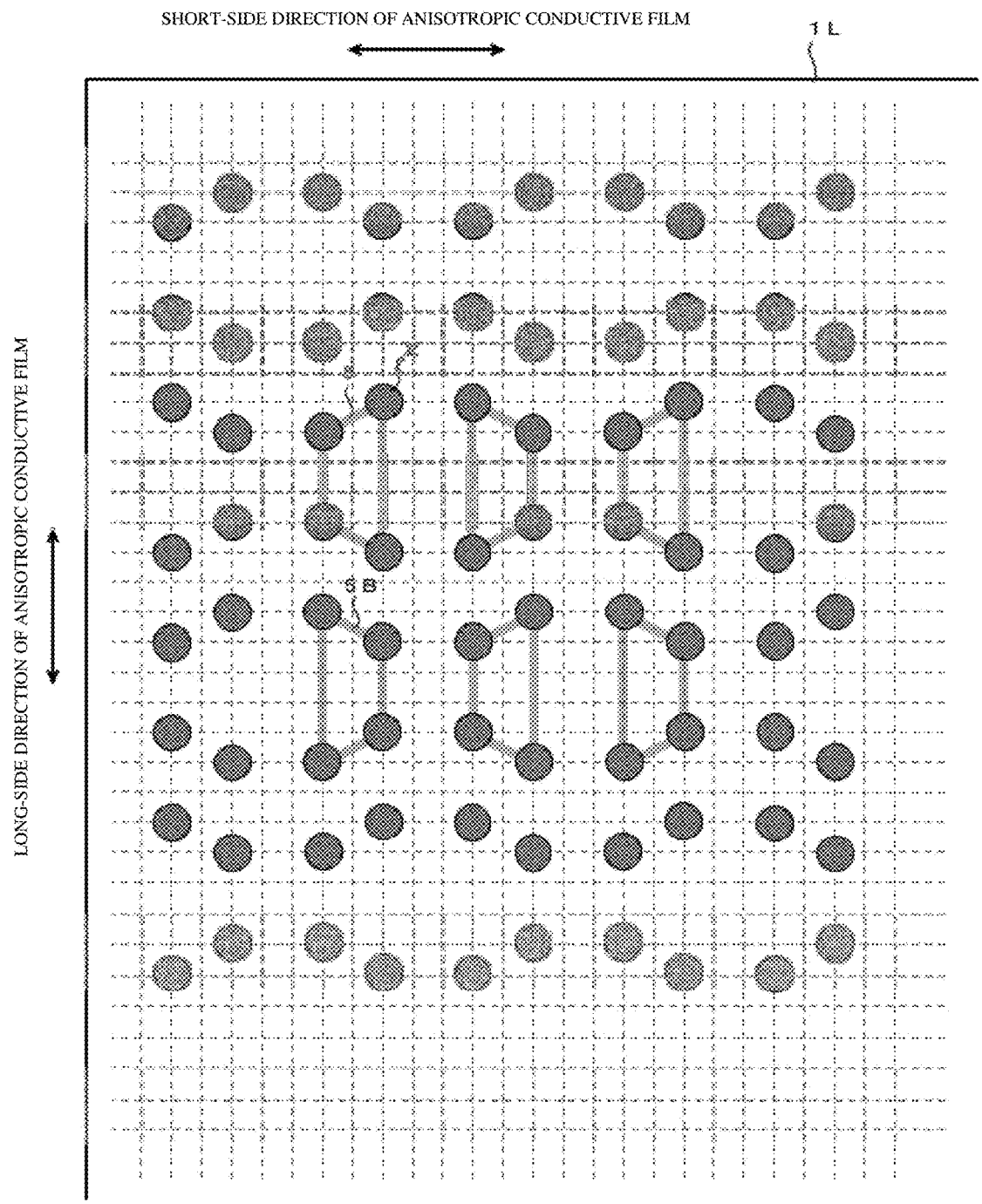

[FIG. 13]
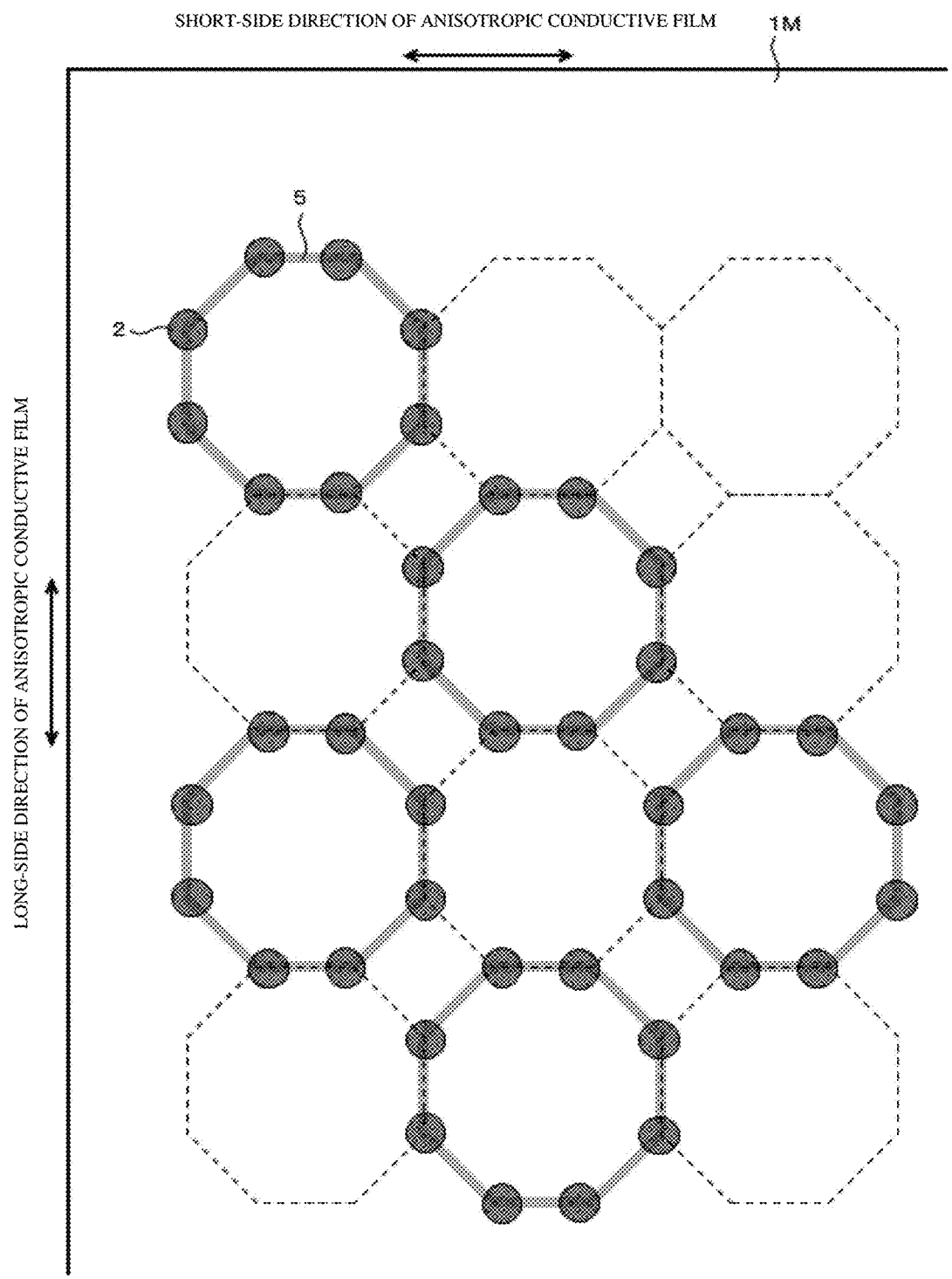

[FIG. 14]
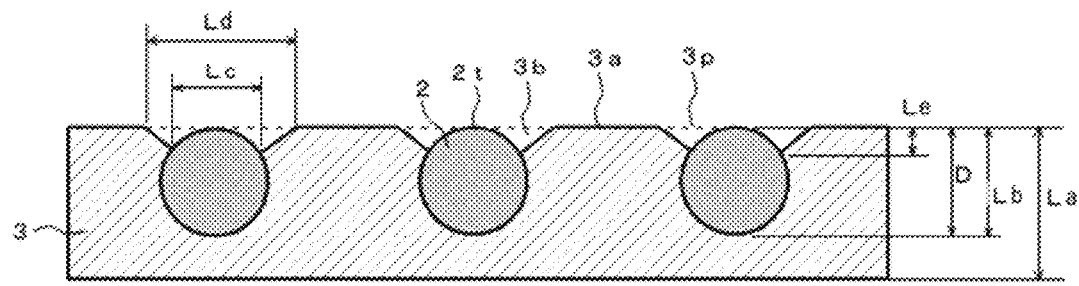
[FIG. 15]
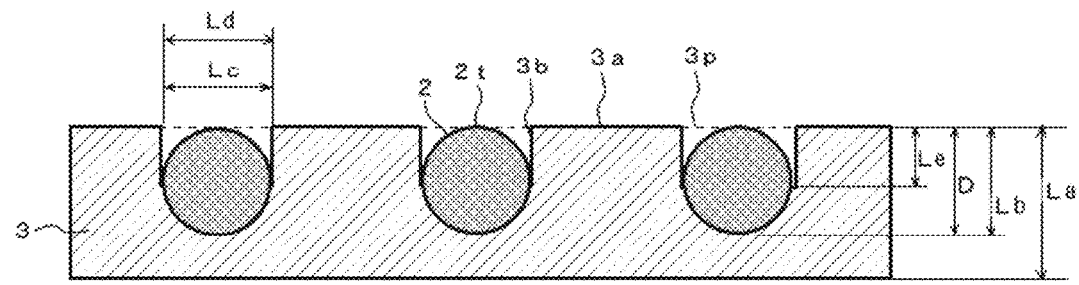
[FIG. 16]
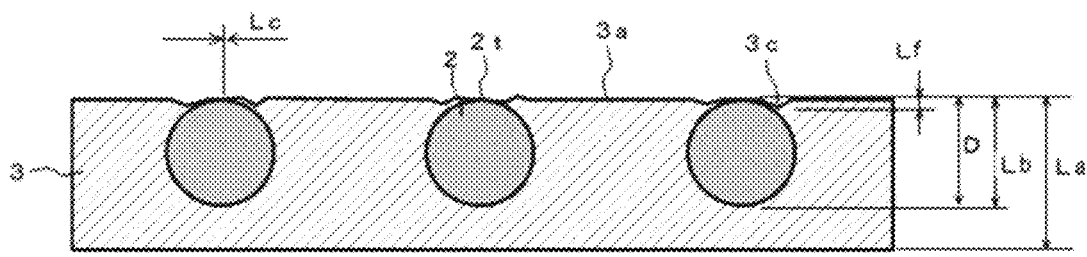

[FIG. 17]
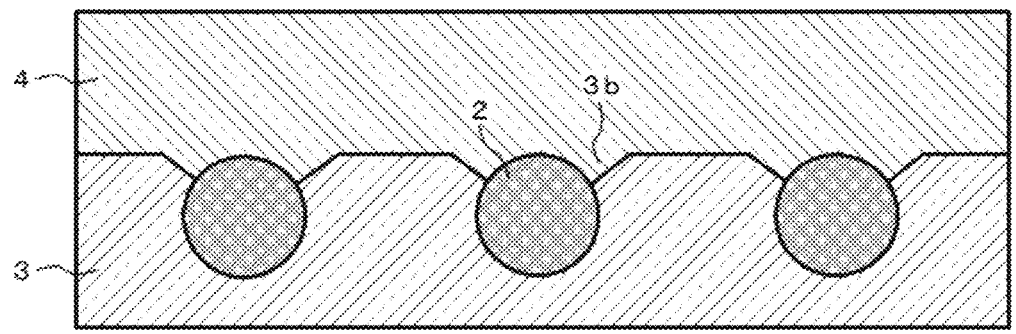
1d
[FIG. 18]
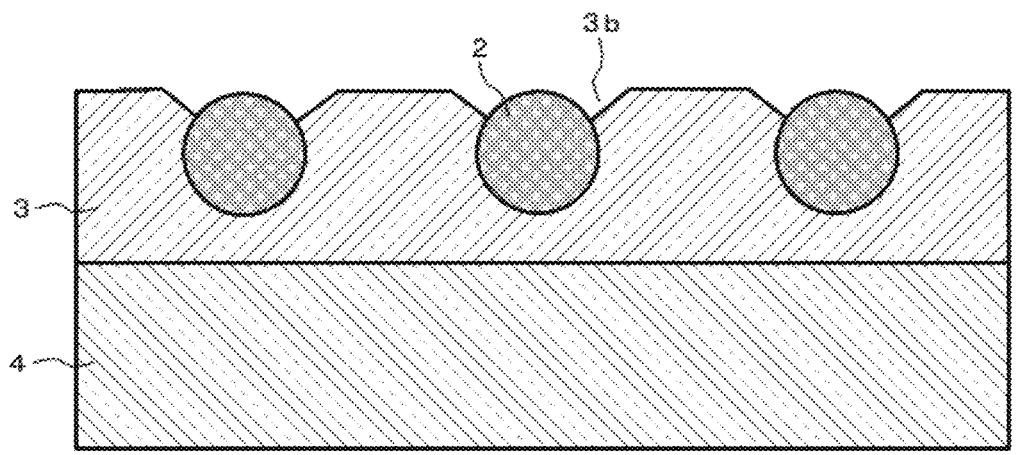
1e

ANISOTROPIC CONDUCTIVE FILM WITH CONDUCTIVE PARTICLES FORMING REPEATING UNITS OF POLYGONS

TECHNICAL FIELD

The present invention relates to an anisotropic conductive film.

BACKGROUND ART

Anisotropic conductive films in which conductive particles are dispersed in an insulating resin binder are widely used when mounting electronic components such as IC chips to wiring boards or the like. In an anisotropic conductive film, there is a strong demand to increase the capacity to capture conductive particles on bumps and to avoid shorting between adjacent bumps due to the narrowed pitch of bumps, which accompany the high-density mounting of electronic components.

To meet such a demand, it has been proposed to use a lattice-like arrangement for the disposition of conductive particles in an anisotropic conductive film and to make the arrangement axis inclined with respect to the long-side direction of the anisotropic conductive film (Patent Documents 1 and 2).

CITATION LIST

Patent Literature

Patent Document 1: JP 4887700 B
Patent Document 2: JP H09-320345 A

SUMMARY OF INVENTION

Technical Problem

As described in Patent Documents 1 and 2, when conductive particles are disposed in a simple lattice form, the layout of the bumps is accommodated by the angle of inclination of the arrangement axis or the distance between conductive particles. Therefore, when the bumps have a narrow pitch, the distance between the conductive particles need to be reduced. The number density of the conductive particles thus increases, and the production cost of the anisotropic conductive film also increases.

In addition, to reduce the distance between conductive particles and to avoid shorting, it is necessary to suppress the flow of conductive particles due to the resin flow of the insulating resin binder at the time of anisotropic conductive connection, which imposes restrictions on the design of the insulating resin binder.

Therefore, an object of the present invention is to make it possible to accommodate bumps with a narrow pitch and to reduce the number density of conductive particles in comparison to conventionally known anisotropic conductive films.

Solution to Problem

The present inventors discovered that the problem described above can be solved by repeatedly disposing conductive particles lengthwise and crosswise by means of repeating units of polygons including a plurality of conductive particles, without arranging the conductive particles into a simple lattice form in a plan view of the anisotropic conductive film, and making the sides that form the polygons oblique with respect to the long-side direction or the short-side direction of the anisotropic conductive film. The present inventors thereby arrived at the present invention.

That is, the present invention is an anisotropic conductive film including conductive particles disposed in an insulating resin binder, wherein repeating units of polygons formed by successively connecting the centers of a plurality of conductive particles are repeatedly disposed in a plan view; and the polygons of the repeating units have sides intersecting diagonally with the long-side direction or the short-side direction of the anisotropic conductive film.

Advantageous Effects of Invention

With the anisotropic conductive film of an embodiment of the present invention, the individual conductive particles are not arranged in a simple lattice form, and repeating units formed by a plurality of conductive particles are disposed repeatedly. Thus, portions in which the distance between conductive particles is narrowed are present uniformly over the entire film. In addition, since the polygons of the repeating units have sides which intersect diagonally with the long-side direction or the short-side direction of the anisotropic conductive film, the capacity to capture conductive particles in the bumps is high. Accordingly, bumps with a narrow pitch can be connected without causing short circuits.

On the other hand, with the anisotropic conductive film of an embodiment of the present invention, portions in which the distance between conductive particles is increased are also present uniformly over the entire film. This can suppress increases in the number density of the conductive particles of the entire anisotropic conductive film, and increases in production cost associated with increases in the number density of the conductive particles. In addition, by suppressing increases in the number density of the conductive particles, increases in the thrust required for the pressing jig at the time of anisotropic conductive connection can also be suppressed. Accordingly, the pressure applied to the electronic component from the pressing jig at the time of anisotropic conductive connection can be reduced, and the deformation of the electronic component can be prevented.

BRIEF DESCRIPTION OF DRAWINGS

FIG. 1A is a plan view for explaining the disposition of conductive particles in an anisotropic conductive film 1A of examples.

FIG. 1B is a plan view for explaining the disposition of conductive particles in an anisotropic conductive film 1A of the examples.

FIG. 1C is a cross-sectional view of the anisotropic conductive film 1A of the examples.

FIG. 2A is a plan view for explaining the disposition of conductive particles in an anisotropic conductive film 1Ba of the examples.

FIG. 2B is a plan view for explaining the disposition of conductive particles in an anisotropic conductive film 1Bb of the examples.

FIG. 3A is a plan view for explaining the disposition of conductive particles in an anisotropic conductive film 1Ca of the examples.

FIG. 3B is a plan view for explaining the disposition of conductive particles in an anisotropic conductive film 1Cb of the examples.

FIG. 4A is a plan view for explaining the disposition of conductive particles in an anisotropic conductive film 1Da of the examples.

FIG. 4B is a plan view for explaining the disposition of conductive particles in an anisotropic conductive film 1Db of the examples.

FIG. 5A is a plan view for explaining the disposition of conductive particles in an anisotropic conductive film 1Ea of the examples.

FIG. 5B is a plan view for explaining the disposition of conductive particles in an anisotropic conductive film 1Eb of the examples.

FIG. 6 is a plan view for explaining the disposition of conductive particles in an anisotropic conductive film 1F of the examples.

FIG. 7 is a plan view for explaining the disposition of conductive particles in an anisotropic conductive film 1G of the examples.

FIG. 8 is a plan view for explaining the disposition of conductive particles in an anisotropic conductive film 1H of the examples.

FIG. 9 is a plan view for explaining the disposition of conductive particles in an anisotropic conductive film 1I of the examples.

FIG. 10 is a plan view for explaining the disposition of conductive particles in an anisotropic conductive film 1J of the examples.

FIG. 11 is a plan view for explaining the disposition of conductive particles in an anisotropic conductive film 1K of the examples.

FIG. 12 is a plan view for explaining the disposition of conductive particles in an anisotropic conductive film 1L of the examples.

FIG. 13 is a plan view for explaining the disposition of conductive particles in an anisotropic conductive film 1M of the examples.

FIG. 14 is a cross-sectional view of an anisotropic conductive film 1a of the examples.

FIG. 15 is a cross-sectional view of an anisotropic conductive film 1b of the examples.

FIG. 16 is a cross-sectional view of an anisotropic conductive film 1c of the examples.

FIG. 17 is a cross-sectional view of an anisotropic conductive film 1d of the examples.

FIG. 18 is a cross-sectional view of an anisotropic conductive film 1e of the examples.

DESCRIPTION OF EMBODIMENTS

An anisotropic conductive film of an embodiment of the present invention will be described below in detail with reference to the drawings. Note that in the drawings, the same reference characters are used to indicate components that are the same or equivalent.

Overall configuration of anisotropic conductive film

FIG. 1A is a plan view illustrating the disposition of conductive particles in an anisotropic conductive film 1A of an example of an embodiment of the present invention, and FIG. 1C is a cross-sectional view thereof.

This anisotropic conductive film 1A has a structure in which conductive particles 2 are disposed in a single layer on the surface of an insulating resin binder 3 or in the vicinity thereof, and an insulating adhesive layer 4 is laminated thereon.

Note that the anisotropic conductive film of an embodiment of the present invention may also have a configuration in which the insulating adhesive layer 4 is omitted and the conductive particles 2 are embedded in the insulating resin binder 3.

Conductive Particles

Any conductive particles used in a known anisotropic conductive film may be appropriately selected and used as the conductive particles 2. Examples of the conductive particles include metal particles such as nickel, copper, silver, gold, and palladium and metal-coated resin particles, where the surface of resin particles such as polyamide and polybenzoguanamine is coated with a metal such as nickel. The size of the disposed conductive particles is preferably not less than 1 μm and not greater than 30 μm, more preferably not less than 1 μm and not greater than 10 μm, and even more preferably not less than 2 μm and not greater than 6 μm.

The average particle diameter of the conductive particles 2 can be measured by using an image-type or laser-type particle size distribution meter. The anisotropic conductive film may be observed in a plan view to measure and determine the particle diameter. In this case, preferably at least 200 particles, more preferably at least 500 particles, and even more preferably at least 1000 particles are measured.

The surfaces of the conductive particles 2 are preferably coated by insulating coating, insulating particle treatment, or the like. Such coating is easily peeled from the surfaces of the conductive particles 2 and does not inhibit anisotropic conductive connection. In addition, protrusions may be formed on all or a portion of the surfaces of the conductive particles 2. The height of the protrusions is not greater than 20% and preferably not greater than 10% of the conductive particle diameter.

Disposition of Conductive Particles

An example of the disposition of repeating units when the repeating units 5 of the polygons are trapezoids will be explained in FIGS. 1A to 7 below.

The disposition of the conductive particles 2 in a plan view of the anisotropic conductive film 1A illustrated in FIG. 1A is such that polygonal repeating units 5 formed by successively connecting the centers of a plurality of conductive particles 2a, 2b, 2c, and 2d are repeated in two orthogonal directions (X-direction and Y-direction), resulting in a state in which the repeating units are disposed all over (that is, totally) the anisotropic conductive film 1. Note that the anisotropic conductive film of an embodiment of the present invention may have regions in which no conductive particles are disposed as necessary.

This disposition of the conductive particles 2 can also be viewed as one in which the conductive particles are disposed at some of the vertices of equilateral triangles when equilateral triangles are arranged without spacing (or the vertices of regular hexagons when regular hexagons are arranged without spacing). In other words, this can be considered the disposition after the conductive particles of prescribed lattice points are regularly removed from a disposition in which conductive particles are present at each lattice point of a hexagonal lattice. Therefore, the vertices of the trapezoids of the repeating units 5 including the conductive particles 2a, 2b, 2c, and 2d constitute a portion of regular hexagons formed by combining equilateral triangles and are present at the lattice points of a hexagonal lattice. When inverted around the side 2a-2b of this trapezoid, the side 2c-2d overlaps with the side 2g-2h of the adjacent trapezoidal repeating units (that is, repeating units including conductive particles 2e, 2f, 2g, and 2h).

Note that when considering these repeating units of conductive particles 2, as illustrated in FIG. 1B, the repeating units 5x of regular hexagons including conductive particles 2p, 2q, 2r, 2s, 2t, and 2u can be viewed as being repeated with one overlapping side in the X-direction and repeated without any overlap of sides or vertices in the Y-direction. However, the repeating units in an embodiment of the present invention are preferably interpreted to be polygons including four or more conductive particles and are the smallest units of polygons repeated in the vertical and horizontal directions of the anisotropic conductive film without any overlap of the sides of the polygons.

Each side of the trapezoids of the repeating units 5 (FIG. 1A) intersects diagonally with the long-side direction and the short-side direction of the anisotropic conductive film 1A. As a result, a circumscribing line L1 of a conductive particle 2a in the long-side direction of the anisotropic conductive film passes through a conductive particle 2b adjacent to the conductive particle 2a in the long-side direction of the anisotropic conductive film. In addition, a circumscribing line L2 of the conductive particle 2a in the short-side direction of the anisotropic conductive film passes through a conductive particle 2d adjacent to the conductive particle 2a in the short-side direction of the anisotropic conductive film. Since the long-side direction of an anisotropic conductive film is typically the short-side direction of the bumps at the time of anisotropic conductive connection, when the sides of the polygons of the repeating units 5 intersect diagonally with the long-side direction or the short-side direction of the anisotropic conductive film 1A, a plurality of conductive particles can be prevented from being arranged linearly along the edges of the bumps. This prevents a phenomenon in which a plurality of conductive particles arranged linearly are collectively separated from the terminals so that they no longer contribute to conduction can thereby be avoided. Thus, the capacity to capture the conductive particles 2 can be enhanced.

Note that in an embodiment of the present invention, the repeating units are not necessarily such that all of the sides thereof intersect diagonally with the long-side direction or the short-side direction of the anisotropic conductive film, but from the perspective of the capacity to capture conductive particles when the short-side direction of each bump is the long-side direction of the anisotropic conductive film, each side of the repeating units preferably intersects diagonally with the long-side direction or the short-side direction of the anisotropic conductive film.

In contrast, when the arrangement pattern of the bumps is radial (so-called fan-out bumps), the polygons forming the repeating units preferably have sides in the long-side direction or the short-side direction of the anisotropic conductive film. That is, to ensure that the bumps to be connected are not displaced relative to one another by thermal expansion, the arrangement pattern of the bumps is sometimes radial (for example, JP 2007-19550 A, and JP 2015-232660 A), but in this case, the angles formed by the long-side direction of each bump and the long-side direction and the short-side direction of the anisotropic conductive film gradually change. Therefore, even in a case where the sides of the polygons of the repeating units 5 do not intersect diagonally with the long-side direction or the short-side direction of the anisotropic conductive film, the sides of the polygons of the repeating units 5 intersect diagonally with the edges in the long-side direction of each bump. Accordingly, a phenomenon can be avoided in which many of the conductive particles that were on the edge of a bump are not captured on that bump at the time of anisotropic conductive connecting so that the capacity to capture conductive particles decreases.

On the other hand, a radial arrangement pattern of bumps is ordinarily formed symmetrically. Accordingly, from the perspective of facilitating the confirmation of the quality of the connection state by the indentations after anisotropic conductive connection, the polygons forming the repeating units 5 preferably have sides in the long-side direction or the short-side direction of the anisotropic conductive film. In particular, the polygons forming the repeating units 5 preferably have sides in the long-side direction or the short-side direction of the anisotropic conductive film and have symmetrical shapes around the long-side direction or the short-side direction of the anisotropic conductive film as an axis of symmetry, wherein the repeating units 5 are repeatedly disposed in the long-side direction or the short-side direction of the anisotropic conductive film. For example, as in the case of the anisotropic conductive film 1Ba illustrated in FIG. 2A, the trapezoids of the repeating units 5 may be trapezoids having an axis of symmetry in the short-side direction of the anisotropic conductive film, wherein the bottom side and the top side are parallel to the long-side direction of the anisotropic conductive film, or as in the case of the anisotropic conductive film 1Bb illustrated in FIG. 2B, the bottom side and the top side of the same trapezoidal repeating units may be parallel to the short-side direction of the anisotropic conductive film.

In an embodiment of the present invention, the disposition of the conductive particles 2 in the repeating units 5 or the vertical and horizontal repetition pitch of the repeating units 5 may be varied appropriately in accordance with the shape or pitch of the terminals to be connected through anisotropic conductive connection. Accordingly, in comparison to a case in which the conductive particles 2 are arranged in a simple lattice form, high capturing performance can be achieved with a small number of conductive particles over the entire anisotropic conductive film. For example, to increase the number density of conductive particles in the long-side direction of the anisotropic conductive film with respect to the anisotropic conductive film 1Ba described above, the disposition may be such that the trapezoidal repeating units 5 are repeated in their original shape in the short-side direction of the anisotropic conductive film, and the trapezoidal repeating units 5 and repeating units 5B of a shape formed by inverting the trapezoidal repeating units 5 over an axis in the long-side direction of the film are alternately repeated in the long-side direction of the anisotropic conductive film, as in the anisotropic conductive film 1Ca illustrated in FIG. 3A. In this case, the disposition may be such that the trapezoidal repeating units 5 and the repeating units 5B of a shape formed by inverting the repeating units 5 are also repeated alternately in the short-side direction of the anisotropic conductive film, as in the anisotropic conductive film 1Da illustrated in FIG. 4A.

Similarly, to increase the number density of conductive particles in the short-side direction of the anisotropic conductive film with respect to the anisotropic conductive film 1Bb described above, the disposition may be such that the trapezoidal repeating units 5 are repeated in their original shape in the long-side direction of the anisotropic conductive film, and the repeating units 5 and repeating units 5B of a shape formed by inverting the repeating units 5 over an axis in the short-side direction of the film are alternately repeated in the short-side direction of the anisotropic conductive film, as in the anisotropic conductive film 1Cb illustrated in FIG. 3B. In addition, the disposition may be such that the repeating units 5 and the repeating units 5B of a shape formed by inverting the repeating units 5 are also repeated alternately in the long-side direction and the short-side direction of the anisotropic conductive film, as in the anisotropic conductive film 1Db illustrated in FIG. 4B.

Further, to reduce the number density in the short-side direction of the anisotropic conductive film with respect to the anisotropic conductive film 1Ca described above, the spacing between repeating rows of the repeating units 5 and 5B in the long-side direction of the anisotropic conductive film may be widened, as in the anisotropic conductive film 1Ea illustrated in FIG. 5A, and to reduce the number density in the long-side direction of the anisotropic conductive film, the spacing between repeating rows of the repeating units 5 and 5B in the short-side direction of the anisotropic conductive film may be widened, as in the anisotropic conductive film 1Eb illustrated in FIG. 5B.

In addition, as in the anisotropic conductive film 1F illustrated in FIG. 6, the repetition pitch in the Y-direction of the repeating units 5 may be widened with respect to the disposition of the conductive particles of the anisotropic conductive film 1A illustrated in FIG. 1A. In the disposition of the conductive particles 2 illustrated in FIG. 1A, each conductive particle 2 overlaps with one of the vertices of a regular hexagon when regular hexagons are arranged without spacing, but the disposition of the conductive particles illustrated in FIG. 6 differs from the disposition of the conductive particles illustrated in FIG. 1A in that all of the conductive particles do not necessarily overlap with the vertices of regular hexagons when regular hexagons are arranged without spacing.

In addition, as in the anisotropic conductive film 1G illustrated in FIG. 7, the repetition pitch in the Y-direction may be widened, and a single conductive particle 2p may be disposed between adjacent repeating units 5 in the Y-direction, or another repeating unit may be disposed therebetween. Further, the repetition pitch in the X-direction of the repeating units 5 may be varied appropriately, and a single conductive particle or a separate repeating unit may be disposed between the repetition pitches in the X-direction.

As in the anisotropic conductive film 1H illustrated in FIG. 8, the trapezoidal repeating units 5 or repeating units 5B formed by inverting the repeating units 5 may be repeated in the short-side direction or the long-side direction of the anisotropic conductive film, and rows of single conductive particles 2p may be disposed between the rows of repeating units 5 in the short-side direction of the anisotropic conductive film and the rows of repeating units 5B in the short-side direction of the anisotropic conductive film. As a result, the conductive particles 2 are arranged in a rhombic lattice, resulting in a disposition in which a single conductive particle 2p is present in the center of the unit lattice. To reduce the number density of the conductive particles when the conductive particles are arranged in a rhombic lattice, the repeating units 5 themselves may be formed into a diamond shape, as in the anisotropic conductive film 1I illustrated in FIG. 9. By disposing the conductive particles 2 in a rhombic lattice as illustrated in FIGS. 8 and 9, the conductive particles 2 are present in long-side direction and the short-side direction of the anisotropic conductive film as well as a direction inclined with respect to these directions. This facilitates both the improvement of the capacity to capture conductive particles and the suppression of shorting at the time of anisotropic conductive connection.

In addition, as in the anisotropic conductive film 1J illustrated in FIG. 10, the film may have an arrangement in which a rectangular lattice arrangement of repeating units 5 of diamond shapes including four conductive particles is lined up with an arrangement in which a rectangular lattice arrangement of repeating units 5B of diamond shapes formed by inverting the repeating units 5 in the long-side direction or the short-side direction of the anisotropic conductive film, without any overlapping of the lattice points thereof. As in the anisotropic conductive film 1K illustrated in FIG. 11, the film may have the same particle disposition as that of the anisotropic conductive film 1J illustrated in FIG. 10, and the spacing between the arrays of repeating units 5 and 5B in the short-side direction of the film may be widened.

The repeating units are not limited to a disposition in which the conductive particles cover a portion of the vertices of regular hexagons (that is, the lattice points of a hexagonal lattice) when equilateral triangles are arranged without spacing. The conductive particles may also cover a portion of the lattice points of a square lattice. For example, a disposition in which the same trapezoidal repeating units 5 as in the disposition of conductive particles illustrated in FIG. 5A and repeating units 5B formed by inverting the repeating units 5 are alternately repeated in the long-side direction and the short-side direction of the anisotropic conductive film may be formed on the lattice points of a square lattice, as in the anisotropic conductive film 1L illustrated in FIG. 12.

In addition, the number of vertices forming the polygons of the repeating units is not limited to 4, and may be 5 or greater, 6 or greater, or 7 or greater. However, to facilitate the recognition of the shapes of the repeating units in the design or production process during the production of an anisotropic conductive film, the number of vertices of the repeating units is preferably an even number.

The shape of the polygons forming the repeating units may be a regular polygon or an irregular polygon, but the shape preferably has an axis of symmetry from the perspective of facilitating the recognition of the shapes of the repeating units. In this case, each of the conductive particles constituting the repeating unit is not necessarily present at a lattice point of a hexagonal lattice or a square lattice. For example, as in the anisotropic conductive film 1M illustrated in FIG. 13, the repeating units 5 may be formed from conductive particles positioned at the vertices of a regular octagon. The shape of the polygons of the repeating units can be determined appropriately in accordance with the shape or pitch of the bumps or terminals to be anisotropically conductively connected, the angle of inclination of the long-side direction of the bumps or terminals of the anisotropic conductive film with respect to the long-side direction of the film, the resin composition of the insulating resin binder in the anisotropic conductive film, or the like.

Note that the disposition of conductive particles in an embodiment of the present invention is not limited to the illustrated arrangements of repeating units, and the illustrated arrangements of repeating units may be inclined, for example. In this case, arrangements inclined by 90°, that is, modes in which the long-side direction and the short-side direction of the film are switched are also included. In addition, the spacing of the repeating units and the spacing of the conductive particles within the repeating units may also be varied.

Shortest Distance Between Conductive Particles

The shortest distance between the conductive particles is preferably not less than 0.5 times the average particle diameter of the conductive particles, both between adjacent conductive particles within the repeating units and between adjacent conductive particles between the repeating units. When this distance is too small, shorting becomes more likely to occur due to contact between conductive particles. The upper limit of the distance between adjacent conductive particles is determined in accordance with the bump shape or the bump pitch. For example, when the bump width is 200 μm and the space between bumps is 200 μm and at least one conductive particle is present in either the bump width or the space between bumps, the shortest distance between conductive particles is less than 400 μm. From the perspective of ensuring the capacity for capturing conductive particles, the distance is preferably less than 200 μm.

Number Density of Conductive Particles

From the perspective of suppressing the production cost of the anisotropic conductive film and ensuring that the thrust required for the pressing jig used at the time of anisotropic conductive connecting does not become excessively large, the number density of the conductive particles is preferably not greater than 50000 particles/mm$^2$, more preferably not greater than 35000 particles/mm$^2$, and even more preferably not greater than 30000 particles/mm$^2$ when the average particle diameter of the conductive particles is less than 10 μm. On the other hand, since poor conduction due to the insufficient capture of conductive particles by the terminals is a concern when the number density of the conductive particles is too small, the number density is preferably not less than 300 particles/mm$^2$, more preferably not less than 500 particles/mm$^2$, and even more preferably not less than 800 particles/mm$^2$.

In addition, when the average particle diameter of the conductive particles is not less than 10 μm, the number density is preferably not less than 15 particles/mm$^2$, more preferably not less than 50 particles/mm$^2$, and even more preferably not less than 160 particles/mm$^2$. This is because the area occupancy ratio of the conductive particles also increases as the conductive particle diameter becomes larger. For the same reason, the number density is preferably not greater than 1800 particles/mm$^2$, more preferably not greater than 1100 particles/mm$^2$, and even more preferably not greater than 800 particles/mm$^2$.

Note that the number density of the conductive particles may deviate locally (for example, 200 μm×200 μm) from the number densities described above.

Insulating Resin Binder

As the insulating resin binder 3, a thermo-polymerizable composition, a photopolymerizable composition, a polymerizable composition using both light and heat, or the like that is used as an insulating resin binder in a known anisotropic conductive film may be appropriately selected and used. Of these, examples of thermo-polymerizable compositions include thermal radical polymerizable resin compositions containing an acrylate compound and a thermal radical polymerization initiator, thermal cationic polymerizable resin compositions containing an epoxy compound and a thermal cationic polymerization initiator, and thermal anionic polymerizable resin compositions containing an epoxy compound and a thermal anionic polymerization initiator. Examples of photopolymerizable compositions include photoradical polymerizable resin compositions containing an acrylate compound and a photoradical polymerization initiator. A plurality of types of polymerizable compositions may be used in combination as long as no particular problems arise. An example of combined use is the combined use of a thermal cationic polymerizable composition and a thermal radial polymerizable composition.

Here, a plurality of types of photopolymerization initiators which react with light of different wavelengths may be included. As a result, different wavelengths may be used for the photocuring of a resin forming the insulating resin layer at the time of the production of the anisotropic conductive film and the photocuring of a resin for bonding electronic components to one another at the time of anisotropic conductive connection.

When the insulating resin binder 3 is formed using a photopolymerizable composition, all or a portion of the photopolymerizable composition contained in the insulating resin binder 3 may be photocured by means of photocuring at the time of the production of the anisotropic conductive film. As a result of this photocuring, the disposition of the conductive particles 2 in the insulating resin binder 3 is maintained or stabilized, which yields prospects for the suppression of shorting and the enhancement of capturing. In addition, by adjusting the conditions of this photocuring, the viscosity of the insulating resin layer in the production process of the anisotropic conductive film can be adjusted.

The compounded amount of the photopolymerizable compound in the insulating resin binder 3 is preferably not greater than 30 mass %, more preferably not greater than 10 mass %, and even more preferably less than 2 mass %. This is because when the amount of the photopolymerizable compound is too large, the thrust required for pressing at the time of anisotropic conductive connection increases.

On the other hand, although the thermo-polymerizable composition contains a thermo-polymerizable compound and a thermal polymerization initiator, a compound which also functions as a photopolymerizable compound may also be used as this thermo-polymerizable compound. In addition, the thermo-polymerizable composition may also contain a photopolymerizable compound separately from the thermo-polymerizable compound as well as a photopolymerization initiator. The composition preferably contains a photopolymerizable compound and a photopolymerization initiator separately from the thermo-polymerizable compound. For example, a thermal cation-based polymerization initiator may be used as a thermal polymerization initiator, an epoxy resin may be used as a thermo-polymerizable compound, a photoradical polymerization initiator may be used as a photopolymerization initiator, and an acrylate compound may be used as a photopolymerizable compound. The insulating binder 3 may also contain a cured product of these polymerizable compositions.

The acrylate compound used as a thermo or photopolymerizable compound may be a known thermo-polymerizable (meth)acrylate monomer. Examples thereof include monofunctional (meth)acrylate-based monomers and polyfunctional, that is, two or more functional, (meth)acrylate-based monomers.

In addition, an epoxy compound used as a polymerizable compound forms a three-dimensional mesh structure to provide good heat resistance and adhesiveness, and a solid epoxy resin and a liquid epoxy resin are preferably used in combination. Here, a solid epoxy resin refers to an epoxy resin which is a solid at room temperature. In addition, a liquid epoxy resin refers to an epoxy resin which is a liquid at room temperature. Room temperature refers to the temperature range from 5 to 35° C. prescribed by JIS Z 8703. In an embodiment of the present invention, two or more types of epoxy compounds may be used in combination. An oxetane compound may be used in addition to the epoxy compound.

The solid epoxy resin is not particularly limited as long as it is compatible with the liquid epoxy resin and is a solid at room temperature. Examples thereof include bisphenol A epoxy resins, bisphenol F epoxy resins, polyfunctional epoxy resins, dicyclopentadiene epoxy resins, novolac phenol epoxy resins, biphenol epoxy resins, and naphthalene epoxy resins. One type of these may be used alone, or two or more types may be used in combination. Of these, it is preferable to use a bisphenol A epoxy resin.

The liquid epoxy resin is not particularly limited as long as it is a liquid at room temperature, and examples include bisphenol A epoxy resins, bisphenol F epoxy resins, novolac phenol epoxy resins and naphthalene epoxy resins. One type of these may be used alone, or two or more types may be used in combination. In particular, it is preferable to use a bisphenol A epoxy resin from the perspective of tackiness of the film, flexibility or the like.

Of the thermal polymerization initiator, examples of thermal radical polymerization initiators may include organic peroxides and azo compounds. In particular, organic peroxides may be preferred because they do not produce nitrogen, which can induce bubbles.

The amount of the thermal radical polymerization initiator to be used preferably ranges from 2 to 60 parts by mass, and more preferably from 5 to 40 parts by mass, per 100 parts by mass of a (meth)acrylate compound. When the amount is too small, insufficient curing will occur. When the amount is too large, the product life will decrease.

The thermal cationic polymerization initiator may be a known thermal cationic polymerization initiator for epoxy compounds. Examples of the initiator include iodonium salts, sulfonium salts, phosphonium salts, and ferrocenes, which generate acid via heat. In particular, aromatic sulfonium salts, which exhibit good temperature latency, may be preferred.

The amount of the thermal cationic polymerization initiator to be used preferably ranges from 2 to 60 parts by mass, and more preferably from 5 to 40 parts by mass, per 100 parts by mass of an epoxy compound. When the amount is too small, insufficient curing tends to occur. When the amount is too large, the product life tends to decrease.

A known agent that is ordinarily used can be used as the thermal anionic polymerization initiator. Examples include organic acid dihydrazide, dicyandiamide, amine compounds, polyamide amine compounds, cyanate ester compounds, phenol resins, acid anhydride, carboxylic acid, tertiary amine compounds, imidazole, Lewis acid, Bronsted acid salts, polymercaptan-based curing agents, urea resins, melamine resins, isocyanate compounds, and block isocyanate compounds. One type of these may be used alone, or two or more types may be used in combination. Of these, it is preferable to use a microcapsule-type latent curing agent formed by using an imidazole-modified substance as a core and covering the surface thereof with polyurethane.

The thermo-polymerizable composition preferably contains a film-forming resin. The film-forming resin corresponds to a high-molecular-weight resin having an average molecular weight of not less than 10000, for example, and an average molecular weight of from approximately 10000 to approximately 80000 is preferable from the perspective of film formability. Examples of film-forming resins include various resins such as phenoxy resins, polyester resins, polyurethane resins, polyester urethane resins, acrylic resins, polyimide resins, and butyral resins. These may be used alone, or two or more types may be used in combination. Of these, a phenoxy resin is preferably used from the perspective of film formation state, connection reliability, and the like.

The thermo-polymerizable composition may also contain an insulating filler to adjust the melt viscosity. Examples of this include silica powders and alumina powders. The size of the insulating filler is preferably a particle diameter from 20 to 1000 nm, and the compounded amount is preferably from 5 to 50 parts by mass per 100 parts by mass of the thermo-polymerizable compound (photopolymerizable compound) such as an epoxy compound.

Further, the thermo-polymerizable composition may also contain fillers, softeners, promoters, antioxidants, colorants (pigments and dyes), organic solvents, and ion scavengers which differ from the insulating filler described above.

In addition, stress relaxation agents, silane coupling agents, inorganic fillers, or the like may also be compounded as necessary. Examples of stress relaxation agents include hydrogenated styrene-butadiene block copolymers and hydrogenated styrene-isoprene block copolymers. Examples of silane coupling agents include epoxy-based, methacryloxy-based, amino-based, vinyl-based, mercapto-sulfoxide-based, and ureide-based silane coupling agents. Examples of inorganic fillers include silica, talc, titanium oxide, calcium carbonate, and magnesium oxide.

Note that the insulating resin binder 3 may be formed by depositing a coating composition containing the resin described above to form a layer by a coating method and drying or further curing, or otherwise by forming a film using a known technique in advance. The insulating resin binder 3 may be obtained by laminating a resin layer as necessary. In addition, the insulating resin binder 3 is preferably formed on a release film such as a polyethylene terephthalate film that has been release-treated.

Viscosity of Insulating Resin Binder

The minimum melt viscosity of the insulating resin binder 3 can be determined appropriately in accordance with the production method or the like of the anisotropic conductive film. For example, when a method of holding the conductive particles at a prescribed disposition on the surface of the insulating resin binder and pressing the conductive particles into the insulating resin binder is performed as the production method of the anisotropic conductive film, the minimum melt viscosity of the resin is preferably not less than 1100 Pa·s from the perspective of ensuring that the insulating resin binder enables film formation. In addition, as described below, from the perspective of forming concavities 3b around the exposed portions of the conductive particles 2 pressed into the insulating resin binder 3, as illustrated in FIG. 14 or 15, or from the perspective of forming concavities 3c directly above the conductive particles 2 pressed into the insulating resin binder 3, as illustrated in FIG. 16, the minimum melt viscosity is preferably not less than 1500 Pa·s, more preferably not less than 2000 Pa·s, even more preferably from 3000 to 15000 Pa·s, and particularly preferably from 3000 to 10000 Pa·s. The minimum melt viscosity may be determined in the following manner, for example. A rotary rheometer (available from TA Instruments) is used, a rate of temperature increase of 10° C./min and a measurement pressure of 5 g are maintained to be constant, and a measurement plate of 8 mm in diameter is used. In addition, when a process of pressing the conductive particles 2 into the insulating resin binder 3 preferably at from 40 to 80° C. and more preferably from 50 to 60° C. is performed, the lower limit of the viscosity at 60° C. is preferably not less than 3000 Pa·s, more preferably not less than 4000 Pa·s, and even more preferably not less than 4500 Pa·s, and the upper limit is preferably not greater than 20000 Pa·s, more preferably not greater than 15000 Pa·s, and even more preferably not greater than 10000 Pa·s from the perspective of the formation of the concavities 3b or 3c as described above.

By setting the viscosity of the resin forming the insulating resin binder 3 to a high viscosity as described above, the conductive particles 2 inside the anisotropic conductive film can be prevented from being carried away by the flow of the melted insulating resin binder 3 when the conductive particles 2 are sandwiched between objects to be connected such as opposing electronic components and pressurized while heating at the time of the use of the anisotropic conductive film.

Thickness of Insulating Resin Binder

The thickness La of the insulating resin binder 3 is preferably not less than 1 µm and not greater than 60 µm, more preferably not less than 1 µm and not greater than 30 µm, and even more preferably not less than 2 µm and not greater than 15 µm. In addition, the thickness La of the insulating resin binder 3 is preferably such that the ratio (La/D) is from 0.6 to 10 in the relationship between the thickness La and the average particle diameter D of the conductive particles 2. When the thickness La of the insulating resin binder 3 is too large, the conductive particles tend to be displaced at the time of anisotropic conductive connection, and the capacity to capture conductive particles at the terminals is diminished. This trend is marked when La/D exceeds 10. Thus, La/D is preferably not greater than 8 and more preferably not greater than 6. Conversely, when the thickness La of the insulating resin binder 3 is too small and La/D is less than 0.6, it becomes difficult to keep the conductive particles in a prescribed particle dispersion state or a prescribed arrangement with the insulating resin binder 3. In particular, when the terminal to be connected is a high-density COG, the ratio (La/D) of the layer thickness La of the insulating resin binder 3 to the particle diameter D of the conductive particles 2 is preferably from 0.8 to 2.

Mode in which Conductive Particles are Embedded in the Insulating Resin Binder

The embedded state of conductive particles 2 in the insulating resin binder 3 is not particularly limited, but when anisotropic conductive connection is performed by sandwiching the anisotropic conductive film between opposing parts and applying pressure while heating, the conductive particles 2 are partially exposed from the insulating resin binder 3 to form concavities 3b around the exposed portions of the conductive particles 2 with respect to the tangential plane 3p of the surface 3a of the insulating resin binder in the central portion between adjacent conductive particles 2, as illustrated in FIGS. 14 and 15, or concavities 3c are formed in the insulating resin binder portion directly above the conductive particles 2 pressed into the insulating resin binder 3 with respect to the same tangential plane 3P as that described above, and waves are preferably present in the surface of the insulating resin binder 3 directly above the conductive particles 2, as illustrated in FIG. 16. With respect to the flattening of the conductive particles 2 which occurs when the conductive particles 2 are sandwiched between the electrodes of opposing electronic components and are pressurized while heating, the presence of the concavities 3b illustrated in FIGS. 14 and 15 leads to a reduction in the resistance applied to the conductive particles 2 from the insulating resin binder 3 in comparison to cases in which no concavities 3b are present. Therefore, the conductive particles 2 are more easily sandwiched between the opposing electrodes, and the conduction performance also improves. In addition, of the resins constituting the insulating resin binder 3, when concavities 3c (FIG. 16) are formed in the surface of the resin directly above the conductive particles 2, the pressure at the time of pressurization under heat is more easily concentrated on the conductive particles 2 than when no concavities 3c are present, and the conductive particles 2 are more easily sandwiched between the electrodes, which enhances the conduction performance.

From the perspective of more easily achieving the effect of the concavities 3b and 3c described above, the ratio (Le/D) of the maximum depth Le of the concavities 3b (FIGS. 14 and 15) around the exposed portions of the conductive particles 2 to the average particle diameter D of the conductive particles 2 is preferably less than 50%, more preferably less than 30%, and even more preferably from 20 to 25%. The ratio (Ld/D) of the maximum diameter Ld of the concavities 3b (FIGS. 14 and 15) around the exposed portions of the conductive particles 2 to the average particle diameter D of the conductive particles is preferably not less than 100% and more preferably from 100 to 150%. The ratio (Lf/D) of the maximum depth Lf of the concavities 3c (FIG. 16) in the resin directly above the conductive particles 2 to the average particle diameter D of the conductive particles 2 is preferably greater than 0%, more preferably less than 10%, and even more preferably less than 5%.

Note that the diameter Lc of the exposed portions of the conductive particles 2 is preferably not greater than the average particle diameter D of the conductive particles 2 and is preferably from 10 to 90% of the particle diameter D. The conductive particles 2 may be exposed at one point at the apical part 2t of the particle, or the conductive particles 2 may be completely embedded in the insulating resin binder 3 so that the diameter Lc is zero.

Positions of Conductive Particles in the Thickness Direction of the Insulating Resin Binder From the perspective of more easily achieving the effect of the concavities 3b described above, the ratio (Lb/D) (called the "embedding rate" hereafter) of the distance Lb of the deepest part of the conductive particles 2 from the tangential plane 3p (called the "embedded amount" hereafter) to the average particle diameter D of the conductive particles 2 is preferably not less than 60% and not greater than 105%.

Insulating Adhesive Layer

In the anisotropic conductive film of an embodiment of the present invention, an insulating adhesive layer 4 having a different viscosity or adhesiveness than the resins forming the insulating resin binder 3 may be laminated on the insulating resin binder 3 in which the conductive particles 2 are disposed.

In a case where the concavities 3b described above are formed in the insulating resin binder 3, the insulating adhesive layer 4 may be laminated on the surface where the concavities 3b are formed in the insulating resin binder 3, as in the anisotropic conductive film 1d illustrated in FIG. 17, or may be laminated on the surface on the opposite side as the surface where the concavities 3b are formed, as in the anisotropic conductive film 1e illustrated in FIG. 18. This is also the same for cases in which the concavities 3c are formed in the insulating resin binder 3. As a result of the lamination of the insulating adhesive layer 4, the spaces formed by the electrodes or bumps of the electronic component can be filled when the electronic component is anisotropically conductively connected using the anisotropic conductive film, which makes it possible to enhance the adhesiveness.

In addition, when the insulating adhesive layer 4 is laminated on the insulating resin binder 3, the insulating adhesive layer 4 is preferably on the side of a first electronic component such as an IC chip (in other words, the insulating resin binder 3 is on the side of a second electronic component such as a substrate), regardless of whether the insulating adhesive layer 4 is located on the surface where the concavities 3b and 3c are formed. As a result, the unintended movement of the conductive particles can be avoided, and the capturing performance can be enhanced. Note that, typically, the first electronic component and the second electronic component are subjected to main compression bonding after the anisotropic conductive film is temporarily compression bonded with the second electronic component while the first electronic component such as an IC chip is on the pressing jig side and the second electronic component such as a substrate is on the stage side, but depending on the size of the like of the thermocompression bonding region of the second electronic component, the first electronic component and the second electronic component may be subjected to main compression bonding after the anisotropic conductive film is temporarily compression bonded with the first electronic component.

As the insulating adhesive layer 4, a layer used as an insulating adhesive layer in a known anisotropic conductive film can be selected and used as appropriate. The viscosity of the insulating adhesive layer 4 may be adjusted to a lower level using the same resin as that of the insulating resin binder 3 described above. A greater difference between the minimum melt viscosities of the insulating adhesive layer 4 and the insulating resin binder 3 makes it easier for the space formed by the electrodes or bumps of the electronic component to be filled with the insulating adhesive layer 4, which makes it possible to anticipate an effect of enhancing the adhesiveness between electronic components. In addition, when this difference is greater, the amount of movement of the resin forming the insulating resin binder 3 becomes relatively small at the time of anisotropic conductive connection, and thereby the capacity to capture conductive particles at the terminals is more easily enhanced. From a practical standpoint, the minimum melt viscosity ratio of the insulating adhesive layer 4 and the insulating resin binder 3 is preferably 1:2, more preferably 1:5, and even more preferably 1:8. On the other hand, when this ratio is too large, the protrusion or blocking of the resin may occur when a long anisotropic conductive film is formed into a wound body, and therefore the ratio is preferably not greater than 15 from a practical standpoint. More specifically, the preferable minimum melt viscosity of the insulating adhesive layer 4 satisfies the ratio described above and is not greater than 3000 Pa·s, more preferably not greater than 2000 Pa·s, and particularly preferably from 100 to 2000 Pa·s.

As a method of forming the insulating adhesive layer 4, the layer may be formed by depositing a coating composition containing the same resin as the resin used to form the insulating resin binder 3 with a coating method and drying or further curing, or by forming a film with a known technique in advance.

The thickness of the insulating adhesive layer 4 is preferably not less than 1 μm and not greater than 30 μm, and more preferably not less than 2 μm and not greater than 15 μm.

In addition, the minimum melt viscosity of the entire anisotropic conductive film combining the insulating resin binder 3 and the insulating adhesive layer 4 depends also on the ratio of the thickness of the insulating resin binder 3 to the thickness of the insulating adhesive layer 4, but the minimum melt viscosity may be not greater than 8000 Pa·s from a practical standpoint, and to facilitate the filling of the spaces between bumps, the minimum melt viscosity may be from 200 to 7000 Pa·s and is preferably from 200 to 4000 Pa·s.

Furthermore, an insulating filler such as silica fine particles, alumina, and aluminum hydroxide may be added to the insulating resin binder 3 or the insulating adhesive layer 4 as necessary. The compounded amount of the insulating filler is preferably not less than 3 parts by mass and not greater than 40 parts by mass per 100 parts by mass of resin constituting the layers. Thereby, even when the anisotropic conductive film is melted during anisotropic conductive connection, it is possible to prevent the conductive particles from moving unnecessarily due to the melted resin.

Method for Producing Anisotropic Conductive Film

An example of a method for producing an anisotropic conductive film is a method of producing a transfer mold for disposing conductive particles in a prescribed arrangement, filling the concave portions of the transfer mold with conductive particles, covering the transfer mold with an insulating resin binder 3 formed on a release film and applying pressure, and pressing the conductive particles 2 into the insulating resin binder 3 to transfer the conductive particles 2 to the insulating resin binder 3. Optionally, an insulating adhesive layer 4 may be further laminated on the conductive particles 2. Thus, the anisotropic conductive film 1A can be obtained.

In addition, an anisotropic conductive film may be produced by filling the concave portions of a transfer mold with conductive particles, covering the transfer mold with an insulating resin binder, transferring the conductive particles to the surface of the insulating resin binder from the transfer mold, and pressing the conductive particles on the insulating resin binder into the insulating resin binder. The embedded amount of conductive particles (Lb) can be adjusted by the pressing force, the temperature, or the like at the time of pressing. In addition, the shape and depth of the concavities 3b and 3c can be adjusted by the viscosity of the insulating resin binder, the pressing rate, the temperature, and the like at the time of pressing. For example, the lower limit of the viscosity of the insulating resin binder at the time of the pressing of the conductive particles is preferably not less than 3000 Pa·s, more preferably not less than 4000 Pa·s, and even more preferably not less than 4500 Pa·s, and the upper limit is preferably not greater than 20000 Pa·s, more preferably not greater than 15000 Pa·s, and even more preferably not greater than 10000 Pa·s. In addition, such a viscosity is achieved at a temperature of preferably from 40 to 80° C. and more preferably from 50 to 60° C. More specifically, when producing the anisotropic conductive film 1a having the concavities 3b illustrated in FIG. 14 on the surface of the insulating resin binder, the viscosity of the insulating resin binder at the time of the pressing of the conductive particles is preferably set to 8000 Pa·s (50 to 60° C.), and when producing the anisotropic conductive film 1c having the concavities 3c illustrated in FIG. 16, the viscosity of the insulating resin binder at the time of the pressing of the conductive particles is preferably set to 4500 Pa·s (50 to 60° C.).

Note that the transfer mold that is used may be, other than a mold in which the concave portions are filled with conductive particles, a mold in which a slightly adhesive agent is applied to the upper surfaces of convex portions so that the conductive particles adhere to the upper surfaces.

These transfer molds may be produced by using and applying a known technique such as photolithography or printing.

In addition, the method used to dispose the conductive particles in a prescribed arrangement may be a method using a biaxially stretched film instead of a method using a transfer mold.

Wound Body

The anisotropic conductive film is preferably formed into a film wound body which is wound around a reel so as to be continuously provided for the connection of electronic components. The length of the film wound body may be not less than 5 m and is preferably not less than 10 m. The upper limit is not particularly limited, but from the perspective of the handleability of the shipped product, the length is preferably not greater than 5000 m, more preferably not greater than 1000 m, and even more preferably not greater than 500 m.

The film wound body may also be one in which an anisotropic conductive films which are shorter than the total length are linked with connection tape. There may be a plurality of junctions, and the junctions may be distributed regularly or at random. Since the thickness of the connection tape is not particularly limited as long as the tape does not inhibit performance, but when the tape is too thick, the tape may affect the protrusion or blocking of the resin, the thickness is preferably from 10 to 40 µm. In addition, the film width is not particularly limited but is, for example, from 0.5 to 5 mm.

With a film wound body, a continuous anisotropic conductive connection can be achieved, which can contribute to a reduction in the cost of the connection body.

Connection Structure

The anisotropic conductive film of an embodiment of the present invention can be advantageously employed when anisotropically conductively connecting, by heat or light, a first electronic component, such as an FPC, an IC chip, or an IC module, to a second electronic component, such as an FPC, a rigid substrate, a ceramic substrate, a glass substrate, or a plastic substrate. Additionally, first electronic components can be anisotropically conductively connected by stacking IC chips or IC modules. Connection structures formed in this way and the production methods thereof are included within the scope of the present invention.

One method for connecting electronic components together using the anisotropic conductive film may be as follows, for example. One interface of the anisotropic conductive film is temporarily bonded to a second electronic component such as a wiring board. The one interface is the interface where the conductive particles are present in the vicinity in the film thickness direction. A first electronic component, such as an IC chip, is mounted on the temporarily bonded anisotropic conductive film, and thermocompression bonding is performed from the first electronic component side. This method is preferable from the standpoint of increasing the connection reliability. In addition, a connection may also be made by utilizing photocuring. Note that from the perspective of the efficiency of the connection operation at the time of this connection, the long-side direction of the terminals of the electronic component is preferably aligned with the short-side direction of the anisotropic conductive film.

EXAMPLES

Experimental Examples 1 to 8

Production of Anisotropic Conductive Film

For the anisotropic conductive films to be used in COG connection, the effects of the resin composition of the insulating resin binder and the disposition of the conductive particles on the film forming capacity and conduction properties were investigated as follows.

First, resin compositions forming insulating resin binders and insulating adhesive layers were respectively prepared with the formulas shown in Table 1. In this case, the minimum melt viscosity of the resin composition was adjusted by the preparation conditions of the insulating resin composition. The resin composition forming the insulating resin binder was applied to a PET film with a film thickness of 50 µm using a bar coater, and this was dried for 5 minutes in an oven at 80° C. to form an insulating resin binder layer with the thickness La shown in Table 2 on the PET film. Similarly, an insulating adhesive layer was formed on the PET film with the thickness shown in Table 2.

TABLE 1

| Composition table for COG | | (Part by mass) Composition | | | |
|---|---|---|---|---|---|
| | | A | B | C | D |
| Insulating resin binder | Phenoxy resin (YP-50, Nippon Steel & Sumikin Chemical Co., Ltd.) | 50 | 45 | 40 | 37 |
| | Silica filler (Aerosil R805, Nippon Aerosil Co., Ltd.) | 20 | 10 | 10 | 8 |
| | Liquid epoxy resin (jER828, Mitsubishi Chemical Corporation) | 25 | 40 | 45 | 50 |
| | Silane coupling agent (KBM-403, Shin-Etsu Chemical Co., Ltd.) | 2 | 2 | 2 | 2 |
| | Thermal cationic polymerization initiator (SI-60L, Sanshin Chemical Industry Co., Ltd.) | 3 | 3 | 3 | 3 |
| Insulating adhesive layer | Phenoxy resin (YP-50, Nippon Steel & Sumikin Chemical Co., Ltd.) | | 40 | | |
| | Silica filler (Aerosil R805, Nippon Aerosil Co., Ltd.) | | 5 | | |
| | Liquid epoxy resin (jER828, Mitsubishi Chemical Corporation) | | 50 | | |
| | Silane coupling agent (KBM-403, Shin-Etsu Chemical Co., Ltd.) | | 2 | | |
| | Thermal cationic polymerization initiator (SI-60L, Sanshin Chemical Industry Co., Ltd.) | | 3 | | |

Next, a mold was produced so that the disposition of the conductive particles in a plan view was the disposition shown in Table 2, and the center distance of the closest conductive particles in the repeating units thereof was 6 µm. Pellets of a known transparent resin were then fed into the mold in a molten state and then hardened by cooling so that a resin mold is formed with the concavities disposed as shown in Table 2. Here, in Experimental Example 8, the disposition of the conductive particles was a hexagonal lattice arrangement (number density: 32000 particles/mm$^2$), and one lattice axis thereof was inclined by 15° with respect to the long-side direction of the anisotropic conductive film.

Metal-coated resin particles (Sekisui Chemical Co. Ltd., AUL703, average particle diameter: 3 µm) were prepared as conductive particles, and these conductive particles were used to fill the concavities of the resin mold. This was covered with the insulating resin binder described above and pressed at 60° C. and at 0.5 MPa to achieve bonding. The insulating resin binder was then peeled from the mold, and the conductive particles on the insulating resin binder were pressurized (pressing conditions: 60 to 70° C., 0.5 MPa) to press the particles into the insulating resin binder, thereby producing a film in which the conductive particles were embedded in the insulating resin binder in the state shown in Table 2. In this case, the embedded state of the conductive particles was controlled by the pressing conditions. As a result, in Experimental Example 4, the film shape was not maintained after the conductive particles were pressed, but in the other experimental examples, films in which conductive particles were embedded were successfully produced. In observations with a metallurgical microscope, concavities were observed as shown in Table 2 around the exposed portions of the embedded conductive particles or directly above the embedded conductive particles. Note that although both concavities around the exposed portions of the conductive particles and concavities directly above the conductive particles were observed in each of the experimental examples excluding Experimental Example 4, the measurement values for the cases in which concavities were most clearly observed for each experimental example are shown in Table 4.

By laminating an insulating adhesive layer on the side where the conductive particles were pressed on the film in which conductive particles were embedded, an anisotropic conductive film with a two-layer type of resin layer was produced. However, in Experimental Example 4, since the film shape was not maintained after the conductive particles were pressed further evaluations were not made.

Evaluation

The anisotropic conductive film of each experimental example was measured for (a) the initial conduction resistance and (b) the conduction reliability as follows. Results are shown in Table 2.

(a) Initial Conduction Resistance

The anisotropic conductive film of each experimental example was sandwiched between a glass substrate on a stage and an IC for conduction property evaluation on the pressing tool side, and the film was pressed while heating with a pressing tool (180° C., 5 seconds) to obtain a each connected object for evaluation. In this case, the thrust produced by the pressing tool was varied in the three stages of low (40 MPa), medium (60 MPa), and high (80 MPa) to obtain three types of connected objects for evaluation.

Here, the terminal patterns of the IC for conduction property evaluation and glass substrate corresponded to each other, and the sizes thereof were as described below. In addition, when connecting the IC for evaluation and the glass substrate, the long-side direction of the anisotropic conductive film and the short-side direction of the bumps were aligned.

IC for Conduction Property Evaluation
  Outer shape: 1.8×20.0 mm
  Thickness: 0.5 mm
  Bump specifications: size: 30×85 µm; distance between bumps: 50 µm; bump height: 15 µm Glass Substrate (ITO Wiring)
  Glass material: 1737F manufactured by Corning Inc.
  Dimensions: 30×50 mm
  Thickness: 0.5 mm
  Electrode: ITO wiring The initial conduction resistance of the obtained connected object for evaluation was measured and evaluated according to the following three stages of evaluation criteria.

Evaluation criteria for initial conduction resistance (there is no problem from a practical standpoint as long as the resistance is less than 2Ω)
  A: less than 0.4 Ω
  B: not less than 0.4 and less than 0.8 Ω
  C: not less than 0.8 Ω

(b) Conduction Reliability

The connected object for evaluation produced in (a) was placed in a thermostatic chamber for 500 hours at a temperature of 85° C. and a humidity of 85% RH to perform a reliability test, and the conduction resistance thereafter was measured in the same manner as in the case of the initial conduction resistance and evaluated according to the following three stages of evaluation criteria.

Evaluation criteria for conduction reliability (there is no problem from a practical standpoint as long as the resistance is less than 5Ω)
  A: less than 1.2 Ω
  B: not less than 1.2Ω and less than 2 Ω
  C: not less than 2Ω

TABLE 2

| COG evaluation | | Experimental Example 1 | Experimental Example 2 | Experimental Example 3 | Experimental Example 4 | Experimental Example 5 | Experimental Example 6 | Experimental Example 7 | Experimental Example 8 |
|---|---|---|---|---|---|---|---|---|---|
| Resin composition | | A | B | C | D | A | A | A | A |
| Film shape after pressing of conductive particles | | OK | OK | OK | NG | OK | OK | OK | OK |
| Conductive particle diameter: D (µm) | | 3 | 3 | 3 | 3 | 3 | 3 | 3 | 3 |
| Disposition of conductive particles | | FIG. 1A | FIG. 1A | FIG. 1A | FIG. 1A | FIG. 4A | FIG. 8 | FIG. 10 | Hexagonal lattice |
| Center distance of closest conductive particles (µm) | | 6 | 6 | 6 | 6 | 6 | 6 | 6 | 6 |
| Thickness (µm) | insulating resin binder layer ($L_a$) | 4 | 4 | 4 | 4 | 4 | 4 | 4 | 4 |
| | Insulating adhesive layer | 14 | 14 | 14 | 14 | 14 | 14 | 14 | 14 |
| | La/D | 1.3 | 1.3 | 1.3 | 1.3 | 1.3 | 1.3 | 1.3 | 1.3 |
| Minimum melt viscosity (Pa · s) | Insulating resin binder layer | 8000 | 2000 | 1500 | 800 | 8000 | 8000 | 8000 | 8000 |
| | Insulating adhesive layer | 800 | 800 | 800 | 800 | 800 | 800 | 800 | 800 |
| | Total melt viscosity | 1200 | 900 | 900 | 800 | 1200 | 1200 | 1200 | 1200 |
| Viscosity at 60° C. (Pa · s) | Insulating resin binder layer | 12000 | 3000 | 2000 | 1100 | 12000 | 12000 | 12000 | 12000 |
| Embedded state of conductive particles | | | | | | | | | |
| Embedding rate (100 × Lb/D) % | | >80 | >95 | >95 | — | >80 | >80 | >80 | >80 |
| Exposed diameter Lc (µm) | | <2.8 | <2.5 | <2.5 | — | <2.8 | <2.8 | <2.8 | <2.8 |
| Presence or absence of concavities | | Present | Present | Present | — | Present | Present | Present | Present |

TABLE 2-continued

| COG evaluation | | Experimental Example 1 | Experimental Example 2 | Experimental Example 3 | Experimental Example 4 | Experimental Example 5 | Experimental Example 6 | Experimental Example 7 | Experimental Example 8 |
|---|---|---|---|---|---|---|---|---|---|
| Maximum depth Le of concavities (Ratio with respect to conductive particle diameter D) | | <50% | <50% | <50% | — | <50% | <50% | <50% | <50% |
| Maximum diameter Ld of concavities (Ratio with respect to conductive particle diameter D) | | <1.3 | <1.3 | <1.3 | — | <1.3 | <1.3 | <1.3 | <1.3 |
| Evaluation | | | | | | | | | |
| Thrust: low 40 MPa | Initial conduction resistance | A | A | A | — | A | A | A | B |
| | Conduction reliability | A | A | A | — | A | A | A | B |
| Thrust: medium 60 MPa | Initial conduction resistance | A | A | A | — | A | A | A | B |
| | Conduction reliability | A | A | A | — | A | A | A | B |
| Thrust: high 80 MPa | Initial conduction resistance | A | A | A | — | A | A | A | A |
| | Conduction reliability | A | A | A | — | A | A | A | A |

It can be seen from Table 2 that in Experimental Example 4 in which the minimum melt viscosity of the insulating resin layer was 800 Pa·s, it is difficult to form a film having concavities in the insulating resin binder near in the vicinity of the conductive particles. On the other hand, it can be seen that in the experimental examples in which the minimum melt viscosity of the insulating resin binder was 1500 Pa·s or higher, concave portions can be formed in the vicinity of the conductive particles of the insulating resin binder by adjusting the conditions at the time of the embedding of the conductive particles, and that the resulting anisotropic conductive films have good conduction properties for COG. In addition, it can be seen that in Experimental Examples 1 to 7 in which the number density of the conductive particles is lower than in Experimental Example 8, which has a hexagonal lattice arrangement, anisotropic conductive connection can be performed at a lower pressure.

(c) Short Circuits Occurrence Rate

The anisotropic conductive films of Experimental Examples 1 to 3 and 5 to 8 were used to obtain connected objects for evaluation under connection conditions of 180° C. and 60 MPa for 5 seconds, and the numbers of short circuits of the obtained connected objects for evaluation were counted to determine the short circuit occurrence rate as a ratio of the number of short circuits counted with respect to the number of terminals of the IC for evaluation.

IC for evaluating the short circuit occurrence rate (comb-shaped TEG (test element group, space: 7.5 μm)):

Dimensions: 15×13 mm
Thickness: 0.5 mm
Bump specifications: size: 25×140 μm; distance between bumps: 7.5 μm; bump height: 15 μm The short circuit occurrence rate is preferably lower than 50 ppm from a practical standpoint, and all of the anisotropic conductive films of Experimental Examples 1 to 3 and 5 to 8 yielded values of less than 50 ppm.

Note that when the conductive particles captured for each bump were measured for each experimental example excluding Experimental Example 4, at least 10 conductive particles were captured in each case.

Experimental Examples 9 to 16

Production of Anisotropic Conductive Film

For the anisotropic conductive films to be used in FOG connection, the effects of the resin composition of the insulating resin binder and the disposition of the conductive particles on the film forming capacity and conduction properties were investigated as follows.

Specifically, resin compositions for forming insulating resin binders and insulating adhesive layers were prepared with the formulas shown in Table 3, and anisotropic conductive films were produced in the same manner as in Experimental Example 1 using these resin compositions. The disposition of the conductive particles and the center distance of the closest conductive particles are shown in Table 4. In Experimental Example 16, the disposition of the conductive particles was a hexagonal lattice arrangement (number density: 15000 particles/mm²), and one lattice axis thereof was inclined by 15° with respect to the long-side direction of the anisotropic conductive film.

In the production process of this anisotropic conductive film, the film shape was not maintained in Experimental Example 12 after the conductive particles were pressed into the insulating resin binder, but the film shape was maintained in the other experimental examples. Therefore, the embedded state of the conductive particles was observed and measured with a metallurgical microscope for the anisotropic conductive films of the experimental examples excluding Experimental Example 12, and the following evaluation was further performed. The embedded state of conductive particles in each experimental example is shown in Table 4. The embedded state shown in Table 4 is a measurement value when the concavities of the insulating resin binder were measured most clearly for each experimental example, in the same manner as in Table 2.

Evaluation

The anisotropic conductive film of each experimental example was measured for (a) the initial conduction resistance and (b) the conduction reliability as follows. Results are shown in Table 4.

(a) Initial Conduction Resistance

The anisotropic conductive film obtained in each experimental example was cut down to 2 mm×40 mm, sandwiched between an FPC for conduction property evaluation and a glass substrate, and pressed while heating (180° C., 5 seconds) with a tool width of 2 mm to obtain a connected object for evaluation. In this case, the thrust produced by the pressing tool was varied in the three stages of low (3 MPa), medium (4.5 MPa), and high (6 MPa) to obtain three types of connected objects for evaluation. The conduction resistance of the obtained connected object for evaluation was measured in the same manner as in Experimental Example 1, and the measurement was evaluated in three stages under the following criteria.

FPC for Evaluation:
  Terminal pitch: 20 μm
  Terminal width/space between terminals: 8.5 μm/11.5 μm
  Polyimide film thickness (PI)/copper foil thickness (Cu)=38/8, Sn plating
Non-Alkali Glass Substrate
  Electrode: ITO wiring
  Thickness: 0.7 mm
Initial Conduction Resistance Evaluation Criteria
  A: less than 1.6 Ω
  B: not less than 1.6Ω and less than 2.0 Ω
  C: not less than 2.0 Ω

(b) Conduction Reliability

The connected object for evaluation produced in (a) was placed in a thermostatic chamber for 500 hours at a temperature of 85° C. and a humidity of 85% RH, and then the conduction resistance was measured in the same manner as in the case of the initial conduction resistance. The measurement was evaluated in three stages under the following criteria.

Conduction Reliability Evaluation Criteria
  A: less than 3.0 Ω
  B: not less than 3.0Ω and less than 4 Ω
  C: not less than 4.0 Ω

It can be seen from Table 4 that in Experimental Example 12 in which the minimum melt viscosity of the insulating resin layer was 800 Pa·s, it is difficult to form a film having concavities. On the other hand, it can be seen that in the experimental examples in which the minimum melt viscosity of the insulating resin layer was 1500 Pa·s or greater, concavities can be formed in the vicinity of the conductive particles of the insulating resin binder by adjusting the conditions at the time of the embedding of the conductive particles, and that the resulting anisotropic conductive films have good conduction properties for FOG.

(c) Short Circuit Occurrence Rate

The number of short circuits of the connected object for evaluation for which the initial conduction resistance was measured was counted, and the short circuit occurrence rate was determined from the counted number of short circuits and the number of gaps of the connected object for evaluation. There is no problem from a practical standpoint as long as the short circuit occurrence rate is less than 100 ppm.

The short occurrence rates were less than 100 ppm in all of Experimental Examples 9 to 11 and 13 to 16.

Note that when the conductive particles captured for each bump were measured for each experimental example excluding Experimental Example 12, at least 10 conductive particles were captured in each case.

TABLE 3

| | | (Part by mass) Composition | | | |
|---|---|---|---|---|---|
| | Composition table for FOG | E | F | G | H |
| Insulating resin binder | Phenoxy resin (YP-50, Nippon Steel & Sumikin Chemical Co., Ltd.) | 55 | 45 | 25 | 5 |
| | Phenoxy resin (FX-316ATM55, Nippon Steel & Sumikin Chemical Co., Ltd.) | | | 20 | 40 |
| | Bifunctional acrylate (A-DCP, Shin-Nakamura Chemical Co., Ltd.) | 20 | 20 | 20 | 20 |
| | Bifunctional urethane acrylate oligomer (UN-9200A, Negami Chemical Industrial Co., Ltd.) | 25 | 35 | 35 | 35 |
| | Silane coupling agent (A-187, Momentive) | 1 | 1 | 1 | 1 |
| | Phosphoric acid methacrylate (KAYAMER PM-2, Nippon Kayaku Co., Ltd.) | 1 | 1 | 1 | 1 |
| | Benzoyl peroxide (Nyper BW, NOF Corporation) | 5 | 5 | 5 | 5 |
| Insulating adhesive layer | Phenoxy resin (FX-316ATM55, Nippon Steel & Sumikin Chemical Co., Ltd.) | | 50 | | |
| | Bifunctional acrylate (A-DCP, Shin-Nakamura Chemical Co., Ltd.) | | 20 | | |
| | Bifunctional urethane acrylate oligomer (UN-9200A, Negami Chemical Industrial Co., Ltd.) | | 30 | | |
| | Silane coupling agent (A-187, Momentive) | | 1 | | |
| | Phosphoric acid methacrylate (KAYAMER PM-2, Nippon Kayaku Co., Ltd.) | | 1 | | |
| | Benzoyl peroxide (Nyper BW, NOF Corporation) | | 5 | | |

TABLE 4

| FOG evaluation | | Experimental Example 9 | Experimental Example 10 | Experimental Example 11 | Experimental Example 12 | Experimental Example 13 | Experimental Example 14 | Experimental Example 15 | Experimental Example 16 |
|---|---|---|---|---|---|---|---|---|---|
| Resin composition | | E | F | G | H | E | E | E | E |
| Film shape after pressing of conductive particles | | OK | OK | OK | NG | OK | OK | OK | OK |
| Conductive particle diameter: D (μm) | | 3 | 3 | 3 | 3 | 3 | 3 | 3 | 3 |
| Disposition of conductive particles | | FIG. 1A | FIG. 1A | FIG. 1A | FIG. 1A | FIG. 4A | FIG. 9 | FIG. 11 | Hexagonal lattice |
| Center distance of closest conductive particles (μm) | | 9 | 9 | 9 | 9 | 9 | 9 | 9 | 9 |
| Thickness (μm) | Insulating resin binder layer ($L^a$) | 4 | 4 | 4 | 4 | 4 | 4 | 4 | 4 |
| | Insulating adhesive layer | 14 | 14 | 14 | 14 | 14 | 14 | 14 | 14 |
| | La/D | 1.3 | 1.3 | 1.3 | 1.3 | 1.3 | 1.3 | 1.3 | 1.3 |

TABLE 4-continued

| FOG evaluation | | Experimental Example 9 | Experimental Example 10 | Experimental Example 11 | Experimental Example 12 | Experimental Example 13 | Experimental Example 14 | Experimental Example 15 | Experimental Example 16 |
|---|---|---|---|---|---|---|---|---|---|
| Minimum melt viscosity (Pa·s) | Insulating resin binder layer | 8000 | 2000 | 1500 | 800 | 8000 | 8000 | 8000 | 8000 |
| | Insulating adhesive layer | 800 | 800 | 800 | 800 | 800 | 800 | 800 | 800 |
| | Total melt viscosity | 1200 | 900 | 900 | 800 | 1200 | 1200 | 1200 | 1200 |
| Viscosity at 60° C. (Pa·s) | Insulating resin binder layer | 12000 | 3000 | 2000 | 1100 | 12000 | 12000 | 12000 | 12000 |
| Embedded state of conductive particles | | | | | | | | | |
| Embedding rate (100 × Lb/D) % | | >80 | >95 | >95 | — | >80 | >80 | >80 | >80 |
| Exposed diameter Lc (μm) | | <2.8 | <2.5 | <2.5 | — | <2.8 | <2.8 | <2.8 | <2.8 |
| Presence or absence of concavities | | Present | Present | Present | — | Present | Present | Present | Present |
| Maximum depth Le of concavities (Ratio with respect to conductive particle diameter D) | | <50% | <50% | <50% | — | <50% | <50% | <50% | <50% |
| Maximum diameter Ld of concavities (Ratio with respect to conductive particle diameter D) | | <1.3 | <1.3 | <1.3 | — | <1.3 | <1.3 | <1.3 | <1.3 |
| Evaluation | | | | | | | | | |
| Thrust: low 3 MPa | Initial conduction resistance | A | A | A | — | A | A | A | B |
| | Conduction reliability | A | A | A | — | A | A | A | B |
| Thrust: medium 4.5 MPa | Initial conduction resistance | A | A | A | — | A | A | A | B |
| | Conduction reliability | A | A | A | — | A | A | A | B |
| Thrust: high 6 MPa | Initial conduction resistance | A | A | A | — | A | A | A | A |
| | Conduction reliability | A | A | A | — | A | A | A | A |

REFERENCE SIGNS LIST 1A, 1Ba, 1Bb, 1Ca, 1Cb, 1Da, 1Db, 1Ea, 1Eb, 1F, 1G, 1H, 1I, 1J, 1K, 1L, 1M, 1a, 1b, 1c, 1d, 1e Anisotropic conductive film
2, 2a, 2b, 2c, 2d, 2e, 2f, 2g, 2h, 2p, 2q, 2r, 2s, 2t, 2u Conductive particle
3 Insulating resin binder
4 Insulating adhesive layer
5, 5B Repeating unit

The invention claimed is:

1. An anisotropic conductive film comprising conductive particles disposed in an insulating resin binder,
wherein repeating units of polygons formed by successively connecting the centers of a plurality of conductive particles are repeatedly disposed in a plan view; and
wherein the polygons of the repeating units have sides, at least one of the sides intersecting diagonally with a long-side direction of the anisotropic conductive film and at least one of the sides do not intersect diagonally with a short-side direction of the anisotropic conductive film;
wherein the repeating units are trapezoids; and
wherein each conductive particle of a repeating unit forms a vertex of the repeating unit.

2. The anisotropic conductive film according to claim 1, wherein the repeating units are disposed all over the anisotropic conductive film.

3. The anisotropic conductive film according to claim 1, wherein the polygons forming the repeating units have a side in the long-side direction or the short-side direction of the anisotropic conductive film.

4. The anisotropic conductive film according to claim 1, wherein when the polygons forming the repeating units are inverted around one side of the polygons, one side of a polygon of a repeating unit after inversion overlaps with one side of an adjacent repeating unit prior to inversion.

5. A connection structure comprising:
the anisotropic conductive film according to claim 1;
a first electronic component; and
a second electronic component,
an anisotropic conductive connection being formed between the first electronic component and the second electronic component using the anisotropic conductive film.

6. A method for producing a connection structure of a first electronic component and a second electronic component, the method comprising performing thermocompression bonding on the first electronic component and the second electronic component via an anisotropic conductive film, wherein the anisotropic conductive film according to claim 1 is used as the anisotropic conductive film.

7. The anisotropic conductive film according to claim 1, wherein the insulating resin binder is obtained by laminating a resin layer.

8. The anisotropic conductive film according to claim 1, wherein the conductive particles are metallic particles or metal-coated resin particles.

9. The anisotropic conductive film according to claim 1, wherein a surface of the conductive particles is coated with an insulating coating.

10. The anisotropic conductive film according to claim 1, wherein when an average particle diameter of the conductive particles is less than 10 μm, a number density of the conductive particles is 300 particles/mm$^2$ or more.

11. The anisotropic conductive film according to claim 1, wherein when an average particle diameter of the conductive particles is less than 10 μm, a number density of the conductive particles is 50,000 particles/mm$^2$ or less.

12. The anisotropic conductive film according to claim 1, wherein when an average particle diameter of the conductive particle is 10 μm or more, a number density of the conductive particles is 15 particles/mm$^2$ or more.

13. The anisotropic conductive film according to claim 1, wherein when an average particle diameter of the conductive particle is 10 μm or more, a number density of the conductive particles is 1,800 particles/mm$^2$ or less.

14. The anisotropic conductive film according to claim 1, wherein a shortest distance between adjacent conductive particles is less than a bump pitch.

15. The anisotropic conductive film according to claim 1, wherein the polygons of the repeating units are repeated in both the long-side direction and the short-side direction of the anisotropic conductive film without any overlap of the sides of the polygons of the repeating units.

16. The anisotropic conductive film according to claim 15, wherein a polygon of a repeating unit that is adjacent to another polygon of a repeating unit has a shape formed by inverting the polygon of the another polygon around one side of the another polygon.

* * * * *